US012618433B2

(12) United States Patent
Lin et al.

(10) Patent No.: US 12,618,433 B2
(45) Date of Patent: May 5, 2026

(54) SUPPORT MECHANISM AND ELECTRONIC DEVICE

(71) Applicant: Huawei Technologies Co., Ltd., Shenzhen (CN)

(72) Inventors: Yangming Lin, Dongguan (CN); Song Wang, Wuhan (CN); Zhengshu Cheng, Wuhan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 69 days.

(21) Appl. No.: 18/811,445

(22) Filed: Aug. 21, 2024

(65) Prior Publication Data

US 2024/0410418 A1     Dec. 12, 2024

Related U.S. Application Data

(63) Continuation of application No. PCT/CN2023/142438, filed on Dec. 27, 2023.

(30) Foreign Application Priority Data

Apr. 19, 2023     (CN) .......................... 202310467146.6

(51) Int. Cl.
　　*H05K 5/02*　　　　(2006.01)
　　*F16C 11/04*　　　　(2006.01)
(52) U.S. Cl.
　　CPC ............ *F16C 11/04* (2013.01); *H05K 5/0226* (2013.01)
(58) Field of Classification Search
　　None
　　See application file for complete search history.

(56) References Cited

U.S. PATENT DOCUMENTS

| | | | | |
|---|---|---|---|---|
| 11,956,378 B2 * | 4/2024 | Kang | ...................... | F16C 11/04 |
| 12,079,047 B2 * | 9/2024 | Hsu | .......................... | F16C 11/04 |
| 12,314,091 B2 * | 5/2025 | Cheng | ................... | H04M 1/022 |
| 2021/0165466 A1 * | 6/2021 | Kang | ................... | G06F 1/1616 |

FOREIGN PATENT DOCUMENTS

| | | |
|---|---|---|
| CN | 113194183 A | 7/2021 |
| CN | 113790211 A | 12/2021 |
| CN | 216951254 U | 7/2022 |
| CN | 115076218 A | 9/2022 |

* cited by examiner

*Primary Examiner* — James Wu
*Assistant Examiner* — Christopher L Augustin
(74) *Attorney, Agent, or Firm* — Slater Matsil, LLP

(57)     ABSTRACT

The support mechanism includes a first rotation module, a second rotation module, and a module support. The first rotation module includes a first door plate, a first support arm, a first housing support, and a first swing rod. The first door plate is used to support a flexible display. The first support arm is rotatably connected to the module support. The first door plate is rotatably connected to the first housing support. The first support arm is slidably connected to the first housing support. The first swing rod is slidably connected to the first door plate. A first end of the first swing rod is rotatably connected to the first housing support. A second end of the first swing rod can abut against the first support arm. When the electronic device falls, the housing support does not have a displacement or has a small displacement relative to the module support.

20 Claims, 11 Drawing Sheets

SUPPORT MECHANISM AND ELECTRONIC DEVICE

CROSS-REFERENCE TO RELATED APPLICATIONS

This application is a continuation of International Application No. PCT/CN2023/142438, filed on Dec. 27, 2023, which claims priority to Chinese Patent Application No. 202310467146.6, filed on Apr. 19, 2023. The disclosures of the aforementioned applications are hereby incorporated by reference in their entireties.

TECHNICAL FIELD

This application relates to the field of electronic device technologies, and in particular, to a support mechanism and an electronic device.

BACKGROUND

Terminal display devices such as a mobile phone and a laptop are common tools for learning, working, and entertainment. It is difficult for a common terminal display device to satisfy both portability and large-screen display. With development of a flexible display, a foldable terminal display device is developed, so that portability of a terminal display device with a large screen is improved.

When the foldable terminal display device falls, a middle frame of the device collapses and falls with a flexible display, and the flexible display fails due to collision and squeezing with other parts. Therefore, support of a hinge of the device for the middle frame needs to be strengthened. A current solution for supporting the middle frame with the hinge has poor effect. When the device falls, the flexible display is severely damaged.

SUMMARY

This application provides a support mechanism and an electronic device, to strengthen support of a hinge of a foldable terminal display device for a middle frame, and alleviate damage to a flexible display when the terminal display device falls.

According to a first aspect, an embodiment of this application provides a support mechanism. The support mechanism may include a first rotation module, a second rotation module, and a module support. The first rotation module and the second rotation module are respectively disposed on two sides of the module support. The first rotation module may include a first door plate, a first support arm, a first housing support, and a first swing rod. The first door plate is used to support a flexible display. At least a part of the first support arm is disposed on a surface that is of the first door plate and that faces away from the flexible display. The first support arm is rotatably connected to the module support. At least a part of the first housing support is disposed on a surface that is of the first support arm and that faces away from the first door plate. The first door plate is rotatably connected to the first housing support. The first support arm is slidably connected to the first housing support. At least a part of the first swing rod is disposed on the surface that is of the first door plate and that faces away from the flexible display. The first swing rod is slidably connected to the first door plate, and a first end of the first swing rod is rotatably connected to the first housing support. The second rotation module may include a second door plate, a second support arm, a second housing support, and a second swing rod. The second door plate is used to support the flexible display. At least a part of the second support arm is disposed on a surface that is of the second door plate and that faces away from the flexible display. The second support arm is rotatably connected to the module support. At least a part of the second housing support is disposed on a surface that is of the second support arm and that faces away from the second door plate. The second door plate is rotatably connected to the second housing support. The second support arm is slidably connected to the second housing support. At least a part of the second swing rod is disposed on the surface that is of the second door plate and that faces away from the flexible display. The second swing rod is slidably connected to the second door plate, and a first end of the second swing rod is rotatably connected to the second housing support. When the first housing support and the second housing support rotate relative to each other, the first housing support drives the first support arm to rotate around the module support, and the first housing support drives the first door plate to rotate relative to the first housing support, so that one end that is of the first door plate and that is close to the module support moves in a direction away from the module support; the first door plate drives the first swing rod to rotate relative to the first housing support, so that a second end of the first swing rod moves in a direction away from the first door plate; the second housing support drives the second support arm to rotate around the module support, and the second housing support drives the second door plate to rotate relative to the second housing support, so that one end that is of the second door plate and that is close to the module support moves in a direction away from the module support; and the second door plate drives the second swing rod to rotate relative to the second housing support, so that a second end of the second swing rod moves in a direction away from the second door plate. When the first door plate rotates to a first position and the second door plate rotates to a second position, the first door plate and the second door plate form an included angle, the second end of the first swing rod abuts against the first support arm, and the second end of the second swing rod abuts against the second support arm.

In the technical solution provided in this application, the first rotation module is used as an example. When an electronic device is switched between an unfolded state and a closed state, the first door plate rotates. Because the first swing rod is slidably connected to the first door plate, the first swing rod may rotate relative to the first housing support under driving of the first door plate, and the second end of the first swing rod moves in a direction close to or away from the module support. For example, when the electronic device is switched from the unfolded state to the closed state, the second end of the first swing rod moves in the direction close to the module support. When the electronic device is switched to the closed state, the second end of the first swing rod abuts against the first support arm, that is, the two ends of the first swing rod are respectively connected to the first housing support and the first support arm. The first swing rod provides support between the first housing support and the first support arm, so that a relative position between the first housing support and the first support arm is stable, and a relative position between the first housing support and the module support is therefore stable. If the electronic device falls, the housing support does not have a displacement or has a small displacement relative to the module support. Therefore, the flexible display fastened to the housing support does not have a displacement or has a small displacement. This can effectively prevent the flexible display from collapsing when the electronic device falls and from colliding with and being squeezed by other parts, and the flexible display is not prone to damage.

In a specific implementation solution, a first limiting slot may be provided on a surface that is of the first housing support and that faces the first door plate. The first end of the first swing rod is rotatably disposed in the first limiting slot. A second limiting slot may be provided on a surface that is of the first support arm and that faces the first door plate. The second end of the first swing rod is used to abut against the second limiting slot. A third limiting slot may be provided on a surface that is of the second housing support and that faces the second door plate. The first end of the second swing rod is rotatably disposed in the third limiting slot. A fourth limiting slot is provided on a surface that is of the second support arm and that faces the second door plate. The second end of the second swing rod is used to abut against the fourth limiting slot. When the electronic device is switched to the closed state, the second end of the first swing rod abuts against the second limiting slot, so that the first swing rod provides support between the first housing support and the first support arm. Similarly, the second end of the second swing rod abuts against the fourth limiting slot, so that the second swing rod provides support between the second housing support and the second support arm.

When the swing rod is specifically disposed, the first end of the first swing rod may be rotatably disposed in the first limiting slot by using a first rotation shaft, to implement a rotatable connection relationship between the first swing rod and the first housing support. The first end of the second swing rod may be rotatably disposed in the third limiting slot by using a second rotation shaft, to implement a rotatable connection relationship between the second swing rod and the second housing support.

In a specific implementation solution, a first mounting bracket may be disposed on the surface that is of the first door plate and that faces away from the flexible display. A first limiting sliding slot is provided between the first end and the second end of the first swing rod. One end of the first mounting bracket is fastened to the first door plate, and the other end of the first mounting bracket is slidably disposed in the first limiting sliding slot, to implement a slidable connection relationship between the first swing rod and the first door plate. A second mounting bracket may be disposed on the surface that is of the second door plate and that faces away from the flexible display. A second limiting sliding slot is provided between the first end and the second end of the second swing rod. One end of the second mounting bracket is fastened to the second door plate, and the other end of the second mounting bracket is slidably disposed in the second limiting sliding slot, to implement a slidable connection relationship between the second swing rod and the second door plate.

When the mounting bracket is specifically disposed, the other end of the first mounting bracket may be slidably disposed in the first limiting sliding slot by using the first limiting shaft, so that the first mounting bracket is slidably connected to the first swing rod. The other end of the second mounting bracket may be slidably disposed in the second limiting sliding slot by using the second limiting shaft, so that the second mounting bracket is slidably connected to the second swing rod.

In a specific implementation solution, when the first door plate rotates to the first position and the second door plate rotates to the second position, the first door plate and the second door plate may form the included angle, and the first swing rod and the second swing rod may be parallel or form an included angle. In this case, the two ends of the first swing rod are respectively connected to the first housing support and the first support arm, and the first swing rod may provide support between the first housing support and the first support arm. The second swing rod may provide support between the second housing support and the second support arm in a similar way. The first swing rod and the second swing rod may be parallel or form the small included angle.

In a specific implementation solution, a first protrusion may be provided on the surface that is of the first support arm and that faces away from the first door plate. The first protrusion is used to abut against the first end of the first swing rod, to push the first swing rod to rotate until the second end of the first swing rod abuts against the first support arm, so that the first swing rod can reliably rotate in place to abut against the first support arm, and effectively support the first housing support. A second protrusion may be provided on the surface that is of the second support arm and that faces away from the second door plate. The second protrusion is used to abut against the first end of the second swing rod, to push the second swing rod to rotate until the second end of the second swing rod abuts against the second support arm, so that the second swing rod can reliably rotate in place to abut against the second support arm, and effectively support the second housing support.

In a specific implementation solution, a first elastic part may be disposed between the first housing support and one end that is of the first door plate and that is away from the module support. Two ends of the first elastic part respectively abut against the first housing support and the end that is of the first door plate and that is away from the module support. The first elastic part is used to push the first door plate to rotate to the first position, so that the first door plate can rotate in place when the electronic device is switched to the closed state, and the first swing rod reliably rotates in place to abut against the first support arm. A second elastic part may be disposed between the second housing support and one end that is of the second door plate and that is away from the module support. Two ends of the second elastic part respectively abut against the second housing support and the end that is of the second door plate and that is away from the module support. The second elastic part is used to push the second door plate to rotate to the second position, so that the second door plate can rotate in place when the electronic device is switched to the closed state, and the second swing rod reliably rotates in place to abut against the second support arm.

In a specific implementation solution, a first torsion spring may be disposed between the first housing support and the end that is of the first door plate and that is close to the module support. The first torsion spring is rotatably disposed on the first housing support. The first torsion spring has a first rotation arm and a second rotation arm. The first rotation arm abuts against the end that is of the first door plate and that is close to the module support. The second rotation arm abuts against the first housing support. The first torsion spring is used to push the first door plate to rotate to the first position, so that the first door plate can rotate in place when the electronic device is switched to the closed state, and the first swing rod reliably rotates in place to abut against the first support arm. A second torsion spring may be disposed between the second housing support and the end that is of the second door plate and that is close to the module support. The second torsion spring is rotatably disposed on the second housing support. The second torsion spring has a third rotation arm and a fourth rotation arm. The third rotation arm abuts against the end that is of the second door plate and that is close to the module support. The fourth rotation arm abuts against the second housing support. The second torsion spring is used to push the second door plate to rotate to the second position, so that the second door plate can rotate in place when the electronic device is switched to the closed state, and the second swing rod reliably rotates in place to abut against the second support arm.

When the torsion spring is specifically disposed, the first torsion spring may be rotatably disposed on the first housing support by using a first coupling shaft, so that the first torsion spring is rotatably connected to the first housing support. The second torsion spring may be rotatably disposed on the second housing support by using a second coupling shaft, so that the second torsion spring is rotatably connected to the second housing support.

In a specific implementation solution, the first rotation module may further include a first swing arm and a first connecting rod. At least a part of the first swing arm is disposed on the surface that is of the first door plate and that faces away from the flexible display. The first swing arm and the first support arm are distributed along a length direction of the support mechanism. The first swing arm is rotatably connected to the module support. Rotation axes of the first swing arm and the first support arm on the module support are different and parallel to each other. One end of the first connecting rod is rotatably connected to the first swing arm. The other end of the first connecting rod is rotatably connected to the first door plate. The first torsion spring is rotatably disposed at the end that is of the first connecting rod and that is rotatably connected to the first swing arm, so that the first torsion spring can push the first door plate to rotate. The second rotation module may further include a second swing arm and a second connecting rod. At least a part of the second swing arm is disposed on the surface that is of the second door plate and that faces away from the flexible display. The second swing arm and the second support arm are distributed along the length direction of the support mechanism. The second swing arm is rotatably connected to the module support. Rotation axes of the second swing arm and the second support arm on the module support are different and parallel to each other. One end of the second connecting rod is rotatably connected to the second swing arm, and the other end of the second connecting rod is rotatably connected to the second door plate. The second torsion spring is rotatably disposed at the end that is of the second connecting rod and that is rotatably connected to the second swing arm, so that the second torsion spring can push the second door plate to rotate.

According to a second aspect, an embodiment of this application provides an electronic device. The electronic device may include a first housing, a second housing, a flexible display, and the support mechanism according to any implementation solution of the first aspect. The first housing and the second housing may be respectively disposed on two sides of the support mechanism. The first housing is fastened to a first housing support. The second housing is fastened to a second housing support. The flexible display may contiguously cover the first housing, the second housing, and the support mechanism, and the flexible display is fastened to the first housing and the second housing.

In the technical solution provided in this application, when the electronic device falls, the housing support does not have a displacement or has a small displacement relative to the module support. Therefore, the flexible display fastened to the housing support does not have a displacement or has a small displacement. This can effectively prevent the flexible display from collapsing when the electronic device falls and from colliding with and being squeezed by other parts, and can effectively reduce a probability that the flexible display is damaged and fails. Overall stability of the electronic device is high, and a service life is long.

REFERENCE NUMERALS

Figure 1:
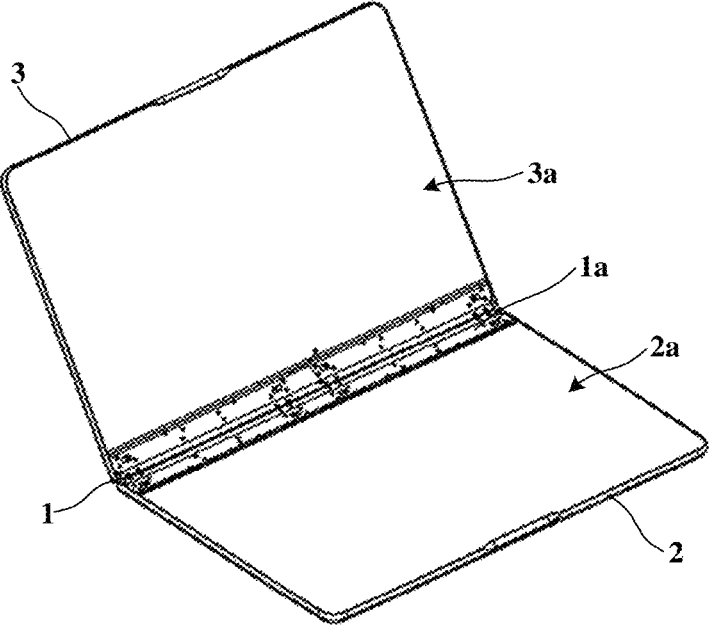
FIG. 1 is a diagram of a structure of an electronic device according to an embodiment of this application.

1: hinge mechanism; 1a: supporting surface of the hinge mechanism;

111: module support; 1111: swing arm support; 11111: first arc-shaped slot; 11113: second arc-shaped slot; 1112: damping support;

1113: pin shaft;

112: first rotation module; 1121: first swing arm; 11211: first arc-shaped rotation block; 11211a: first rotation sub-block;

11211*b*: second rotation sub-block; 11212: first mounting slot; 1122: first support arm; 11221: first sliding block; 11222: first sliding shaft; 1123: first housing support; 11231: first opening groove; 11232: first sliding slot; 112321: first sliding rail; 11233: third arc-shaped rotation block; 1124: first door plate; 112411: second mounting slot;

112412: third arc-shaped slot; 112413: first projection; 1124131: first rotary sliding slot; 1125: first connecting rod;

1126: first swing rod; 11261: first mounting bracket; 11262: first limiting sliding slot; 11263: first limiting shaft;

11264: first limiting slot; 11265: second limiting slot; 11266: first protrusion; 11267: first elastic part;

11268: first torsion spring; 112681: first rotation arm; 112682: second rotation arm;

113: second rotation module; 1131: second swing arm; 11311: second arc-shaped rotation block; 11312: third mounting slot;

1132: second support arm; 1133: second housing support; 11331: second opening groove; 11332: second sliding slot;

11333: fourth arc-shaped rotation block; 1134: second door plate; 113411: fourth mounting slot; 113412: fourth arc-shaped slot;

1135: second connecting rod; 1136: second swing rod; 11361: second mounting bracket; 11362: second limiting sliding slot;

11363: second limiting shaft; 11364: third limiting slot; 11365: fourth limiting slot; 11366: second protrusion; 11367: second elastic part;

114: damping component; 1141: elastic part; 1142: conjoined cam; 1114: intermediate shaft;

115: synchronization component; 1151: first driving gear; 1152: second driving gear; 1153: driven gear;

2: first housing; 2*a*: supporting surface of the first housing;

3: second housing; 3*a*: supporting surface of the second housing.

DETAILED DESCRIPTION OF ILLUSTRATIVE EMBODIMENTS

The following describes in detail embodiments of this application with reference to the accompanying drawings.

For ease of understanding, an application scenario of a support mechanism in this application is first described. The support mechanism provided in embodiments of this application may be adapted to an electronic device, for example, a mobile terminal such as a mobile phone, a tablet computer, or a notebook computer. In a possible application scenario, the support mechanism provided in embodiments of this application may be adapted to a flexible foldable terminal, and is used as a constituent part of a hinge module of the flexible foldable terminal.

The flexible foldable terminal usually includes structural parts such as a flexible display, the hinge module, and a housing. The housing includes a first housing and a second housing that are movably connected by using the hinge module. When the entire flexible foldable terminal is unfolded/closed, the first housing and the second housing rotate relative to each other, the hinge module provides a damping force, and the flexible display is bent.

First, refer to FIG. 1. FIG. 1 is a diagram of a structure of an electronic device according to an embodiment of this application. As shown in FIG. 1, the electronic device provided in this embodiment of this application may include a hinge mechanism 1. A support mechanism provided by a flexible display may be used as a constituent part of the hinge mechanism 1. For ease of description, two housings are respectively named a first housing 2 and a second housing 3. The first housing 2 and the second housing 3 are located on two sides of the hinge mechanism 1 and may rotate around the hinge mechanism 1. When being used, the electronic device may be closed and unfolded based on different use scenarios. The electronic device provided in this embodiment of this application may be an inward-folded electronic device. In the embodiment shown in FIG. 1, the electronic device is in an intermediate state between a closed state and an unfolded state. The figure shows structures of a supporting surface 1*a* of the hinge mechanism 1, a supporting surface 2*a* of the first housing 2, and a supporting surface 3*a* of the second housing 3. Herein, the supporting surface 1*a* of the hinge mechanism 1 is a surface that is of the hinge mechanism 1 and that is used to support the flexible display. The supporting surface 2*a* of the first housing 2 is a surface that is of the first housing 2 and that is used to support the flexible display. The supporting surface 3*a* of the second housing 3 is a surface that is of the second housing 3 and that is used to support the flexible display.

The flexible display may contiguously cover the supporting surface 2*a* of the first housing 2, the supporting surface 1*a* of the hinge mechanism 1, and the supporting surface 3*a* of the second housing 3, and the flexible display may be fastened to the supporting surface 2*a* of the first housing 2 and the supporting surface 3*a* of the second housing 3. A connection manner between the flexible display and the supporting surface 2*a* and the supporting surface 3*a* may be but is not limited to bonding. In this way, when the electronic device is in the unfolded state, the hinge mechanism 1, the first housing 2, and the second housing 3 may support the flexible display. In a process in which the first housing 2 and the second housing 3 relatively rotate from the unfolded state to the closed state, or from the closed state to the unfolded state, the flexible display may be bent or flattened with the first housing 2 and the second housing 3.

Figure 2:
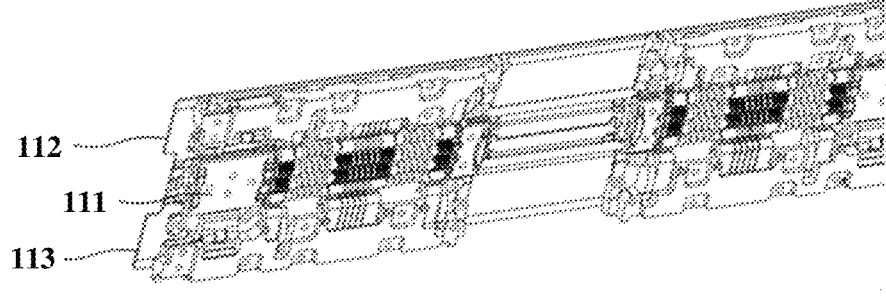
FIG. 2 is a diagram of a partial structure of a support mechanism according to an embodiment of this application.

FIG. 2 is a diagram of a partial structure of the support mechanism according to an embodiment of this application. The support mechanism provided in this embodiment of this application may include a module support 111 and two rotation modules. The two rotation modules are respectively a first rotation module 112 and a second rotation module 113. The module support in may be used as a bearing part of the first rotation module 112 and the second rotation module 113. The first rotation module 112 and the second rotation module 113 are respectively disposed on two sides of the module support in.

For ease of description, in the following embodiments of this application, the support mechanism is described mainly by using a specific disposition manner of the first rotation module 112 as an example, and for deposition of a second rotation module 113 side, refer to that of a first rotation module 112 side. It should be noted that, a design of the second rotation module 113 may be completely the same as that of the first rotation module 112, or reference may be made to only components and connection relationships included in the first rotation module 112, and other parameters may be adaptively adjusted and are not required to be completely the same as those of the first rotation module 112.

Figure 3:
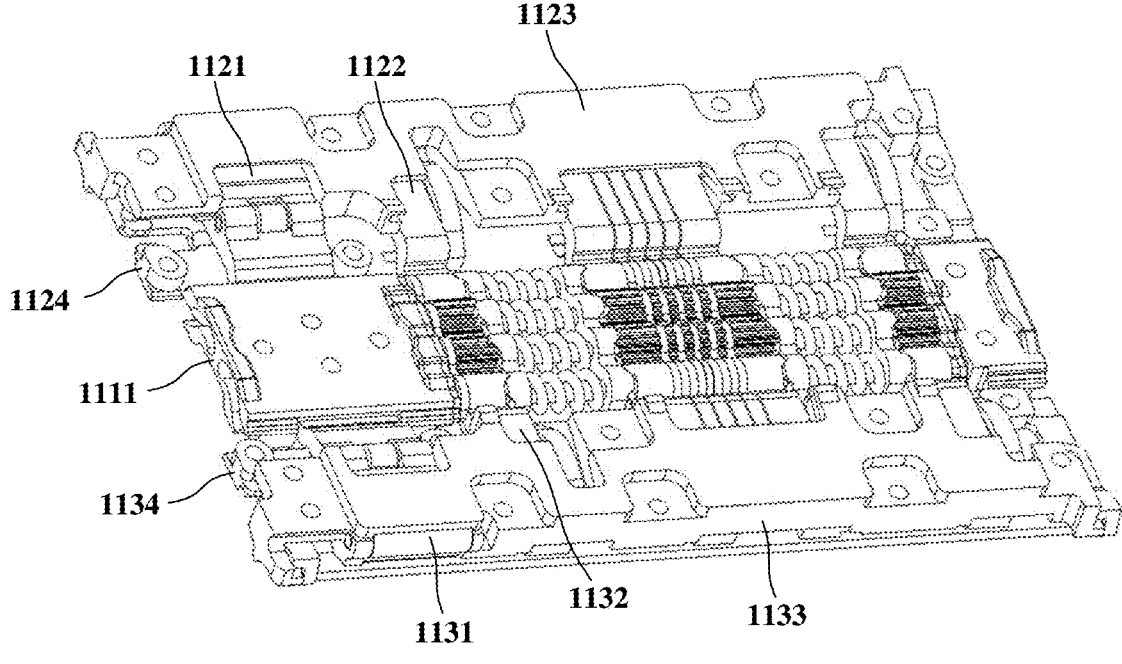
FIG. 3 is a diagram of a partial structure of a support mechanism in an unfolded state according to an embodiment of this application.
Figure 4:
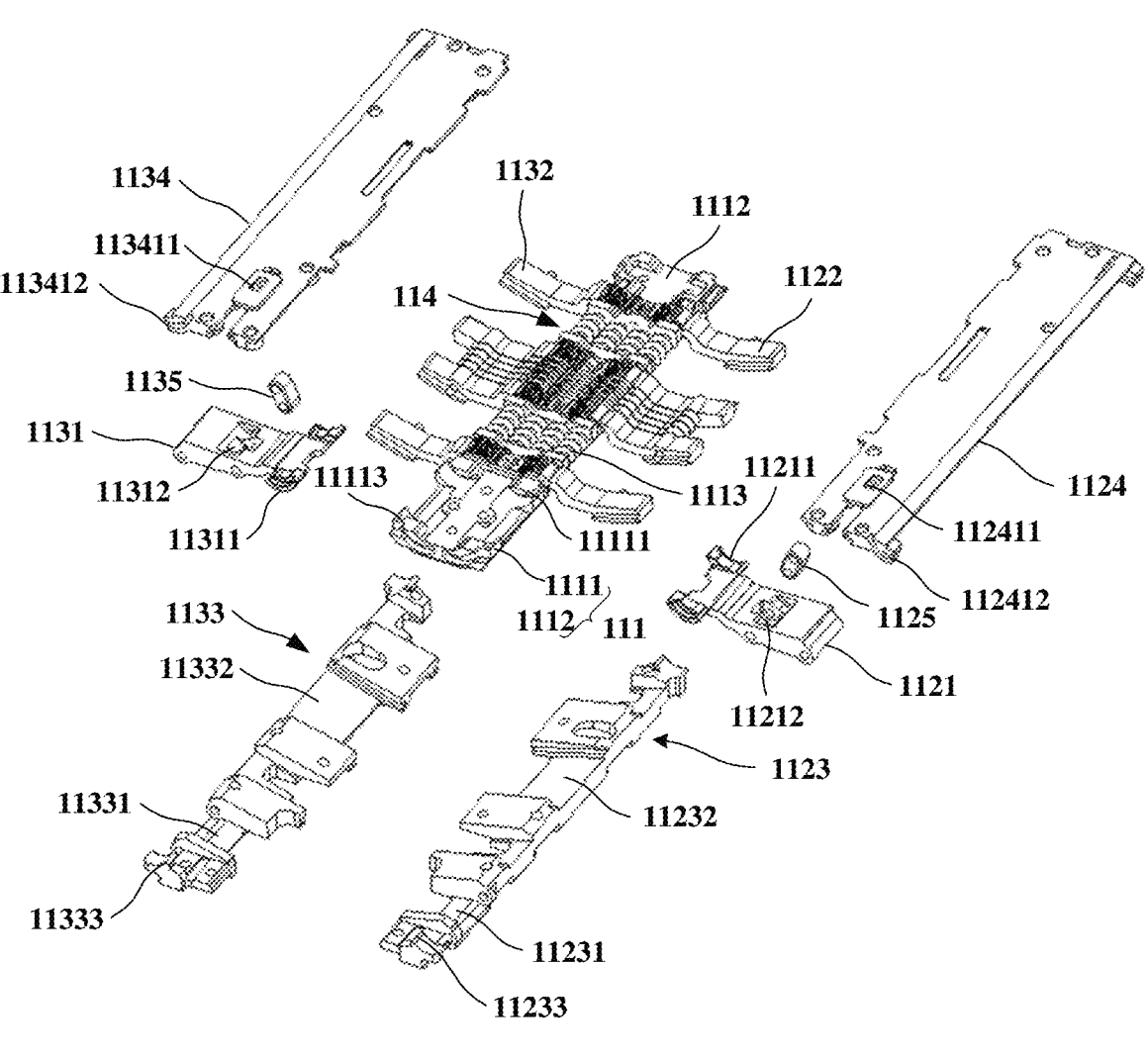
FIG. 4 is a diagram of a partial exploded structure of a support mechanism in an unfolded state according to an embodiment of this application.

Refer to FIG. 3 and FIG. 4 together. FIG. 3 is a diagram of a partial structure of the support mechanism in the unfolded state according to an embodiment of this application. FIG. 4 is a diagram of a partial exploded structure of the support mechanism in the unfolded state according to an embodiment of this application. In this embodiment of this application, the first rotation module 112 may include a first swing arm 1121, a first support arm 1122, a first housing support 1123, and a first door plate 1124. The first door plate 1124 may be used to support the flexible display and is fastened to the flexible display. The first swing arm 1121 and the first support arm 1122 may be disposed on a surface that is of the first door plate 1124 and that faces away from the flexible display. The first swing arm 1121 and the first support arm 1122 may be distributed along a length direction of the support mechanism, and may be separately rotatably connected to the module support 111. The first housing support 1123 may be located on surfaces that are of the first swing arm 1121 and the first support arm 1122 and that face away from the first door plate 1124. The length direction of the support mechanism may be understood as an extension direction of an axis around which the first housing 2 and the second housing 3 rotate around the hinge mechanism. The first housing support 1123 may be used to be fastened to the first housing. The first housing support 1123 may be rotatably connected to the first swing arm 1121, and slidably connected to the first support arm 1122. In an unfolding or folding process of the electronic device, the first housing support rotates synchronously with the first housing, to drive the first swing arm 1121 and the first support arm 1122 to rotate synchronously around the module support 111. In addition, the first housing support 1123 may be further rotatably connected to the first door plate 1124, so that in a rotation process of the first housing support 1123, the first door plate 1124 can also rotate according to a specific track, to provide flat support for the flexible display when the electronic device is in the unfolded state, provide specific screen accommodation space for the flexible display when the electronic device is in the folded state, and ensure reliability of the flexible display.

Figure 5:
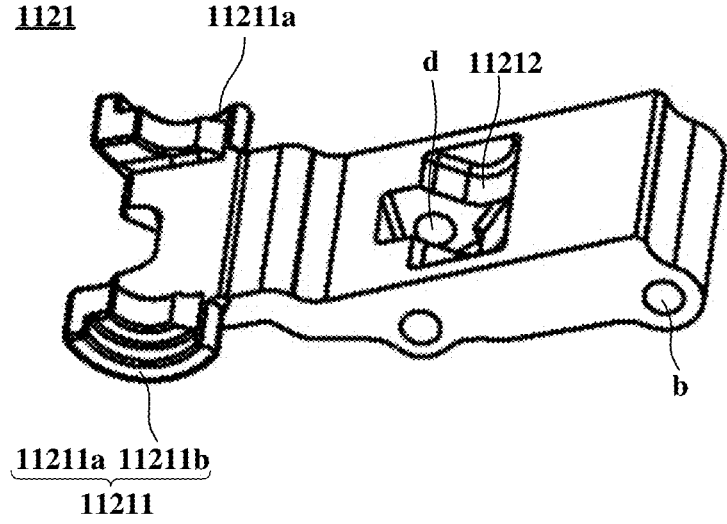
FIG. 5 is a diagram of a structure of a first swing arm according to an embodiment of this application.

FIG. 5 is a diagram of a structure of the first swing arm according to an embodiment of this application. Refer to FIG. 4 and FIG. 5 together. In this embodiment, the module support 11 may include a swing arm support 1111. The first swing arm 1121 may be specifically rotatably connected to the swing arm support 1111, and a rotation axis of the first swing arm 1121 is set along the length direction of the support mechanism. During specific implementation, a first arc-shaped rotation block 11211 may be disposed at one end that is of the first swing arm 1121 and that is used to be connected to the swing arm support 1111. Correspondingly, a first arc-shaped slot 11111 may be provided on the swing arm support 1111. The first arc-shaped rotation block 11211 of the first swing arm 1121 may be accommodated in the first arc-shaped slot 11111, and may rotate along an arc-shaped surface of the first arc-shaped slot 11111, so that the first support arm 1122 rotates around the swing arm support 1111. The manner in which an arc-shaped slot cooperates with an arc-shaped rotation block to implement rotation around an axis determined based on a virtual position may be referred to as a rotatable connection manner of a virtual axis. In other words, two rotation entities do not directly rotate relative to each other by using a physical pin shaft, but are rotatably connected by using the foregoing cooperation structure. This connection manner is conducive to reducing a volume of a main shaft unit, and facilitates a miniaturization design of the hinge mechanism. The first arc-shaped rotation block 11211 may be but is not limited to a circular arc-shaped rotation block, and the first arc-shaped slot 11111 may be but is not limited to a circular arc-shaped slot.

In a specific embodiment, the first arc-shaped rotation block 11211 may include two rotation sub-blocks. The two rotation sub-blocks are respectively a first rotation sub-block 11211a and a second rotation sub-block 11211b. The first rotation sub-block 11211a and the second rotation sub-block 11211b may be arranged at a spacing along the length direction of the support mechanism. Correspondingly, the first arc-shaped slot 11111 may also include a first arc-shaped sub-slot and a second arc-shaped sub-slot. The first arc-shaped sub-slot and the second arc-shaped sub-slot may also be arranged at a spacing along the length direction of the support mechanism. The first rotation sub-block 11211a may be accommodated in the first arc-shaped sub-slot, and may rotate along an arc-shaped surface of the first arc-shaped sub-slot. The second rotation sub-block 11211b may be accommodated in the second arc-shaped sub-slot, and may rotate along an arc-shaped surface of the second arc-shaped sub-slot. Motion stability of the first support arm 1122 relative to a base 12 can be effectively improved through rotation cooperation between the two groups of rotation sub-blocks and arc-shaped sub-slots.

Certainly, in some other embodiments, the first swing arm 1121 may alternatively be rotatably connected to the swing arm support 1111 by using a pin shaft. In this case, hinge holes may be separately provided on the first swing arm 1121 and the swing arm support 1111, and the pin shaft is rotatably disposed in the hinge holes of the first swing arm 1121 and the swing arm support 1111.

Figure 6:
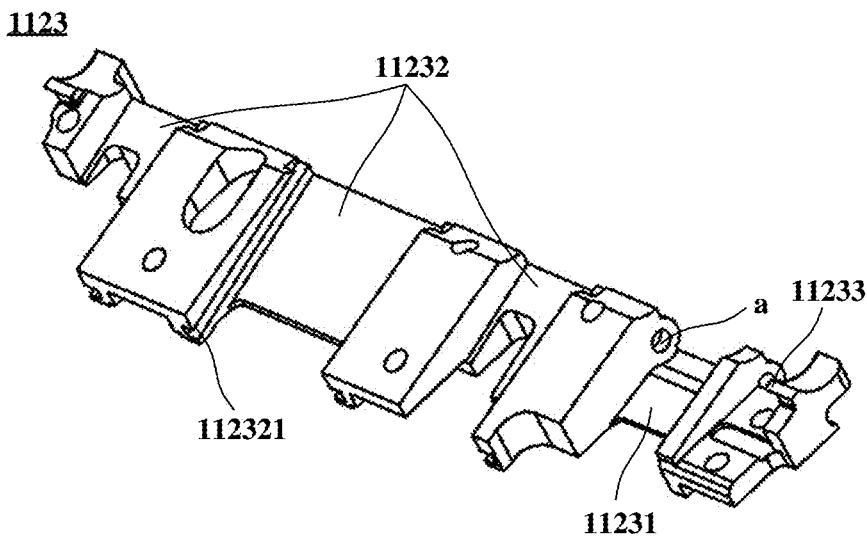
FIG. 6 is a diagram of a structure of a first housing support according to an embodiment of this application.

FIG. 6 is a diagram of a structure of the first housing support according to an embodiment of this application. Refer to FIG. 4 to FIG. 6 together. A first opening groove 11231 may be provided on a side that is of the first housing support 1123 and that faces the first swing arm 1121, and one end that is of the first swing arm 1121 and that is away from the swing arm support 1111 may be disposed in the first opening groove 11231. A hinge hole a may be provided on a groove wall of the first opening groove 11231. Correspondingly, a hinge hole b may be provided on the end that is of the first swing arm 1121 and that is away from the swing arm support 1111. The first swing arm 1121 may be rotatably connected to the first housing support 1123 by using a pin shaft that is rotatably disposed in the hinge hole a of the first swing arm 1121 and the hinge hole b of the first opening groove 11231.

Figure 7:
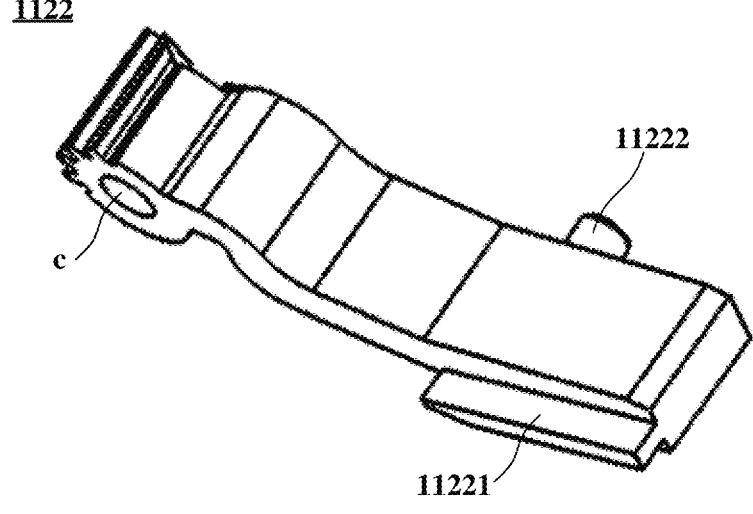
FIG. 7 is a diagram of a structure of a first support arm according to an embodiment of this application.

FIG. 7 is a diagram of a structure of the first support arm according to an embodiment of this application. Refer to FIG. 4 and FIG. 7 together. In this embodiment, the module support in may further include a damping support 1112 and pin shafts 1113. The damping support 1112 and the swing arm support 1111 may be disposed at a spacing along the length direction of the support mechanism. The pin shafts 1113 are connected between the damping support 1112 and the swing arm support 1111, and the pin shafts 1113 are also disposed along the length direction of the support mechanism. A hinge hole c is provided at one end that is of the first support arm 1122 and that is connected to the module support in, and the first support arm 1122 may be sleeved on the pin shaft 1113 through the hinge hole c, so that the first support arm 1122 is rotatably connected to the module support 111.

Refer to FIG. 6 and FIG. 7 together. A first sliding slot 11232 may be further provided on the first housing support 1123. The first sliding slot 11232 and the first opening groove 11231 may be located on a same side of the first housing support 1123. One end that is of the first support arm 1122 and that is away from the module support 111 is mounted in the first sliding slot 11232, and may slide in the first sliding slot 11232. In addition, to prevent the first support arm 1122 from falling off in the first sliding slot 11232, a first sliding rail 112321 may be provided on a groove wall of the first sliding slot 11232. Correspondingly, a first sliding block 11221 may be disposed on a side of the first support arm 1122, and the first sliding block 11221 may be slidably disposed in the first sliding rail 112321. In this way, limiting of the first support arm 1122 in the first sliding slot 11232 can be implemented. In addition, the first sliding rail 112321 may also be used to provide guidance for sliding of the first support arm 1122 in the first sliding slot 11232, to improve motion stability of the first support arm 1122.

In addition, in some possible embodiments, there may be one or more first support arms 1122. FIG. 4 shows a case in which there are three first support arms 1122, and the three first support arms 1122 may be arranged along the length direction of the support mechanism. Correspondingly, the first sliding slot 11232/first sliding slots 11232 that is/are in a one-to-one correspondence with the one or more first support arms 1122 may be provided on the first housing support 1123, and each first support arm 1122 is slidably assembled in the corresponding first sliding slot 11232. Through cooperation between a plurality of groups of first support arms 1122 and first sliding slots 11232, connection stability between the first support arm 1122 and the first housing support 1123 can be effectively improved, and motion stability of the first housing support 1123 can be further improved.

Figure 8:
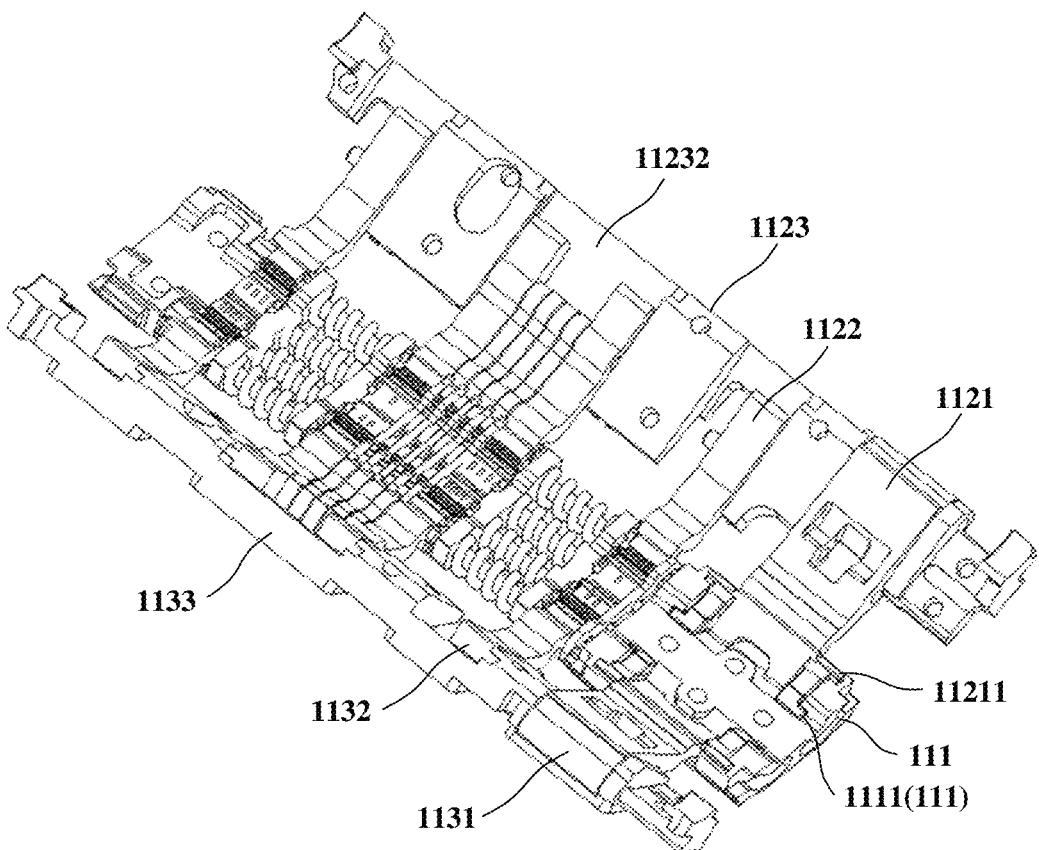
FIG. 8 is a diagram of a partial structure of a support mechanism according to an embodiment of this application.

FIG. 8 is a diagram of a partial structure of the support mechanism according to an embodiment of this application. As shown in FIG. 8, with reference to the foregoing description, it can be learned that the first swing arm 1121, the first housing support 1123, and the first support arm 1122 may roughly form a crank-connecting rod mechanism. When the electronic device is switched from the unfolded state to the closed state, the first housing support 1123 rotates anticlockwise. The first housing support 1123 may drive, based on a rotatable connection relationship between the first swing arm 1121 and the first housing support 1123 and a slidable connection relationship between the first support arm 1122 and the first housing support 1123, the first swing arm 1121 and the first support arm 1122 to rotate anticlockwise around the module support in synchronously. Parts that are of the first arc-shaped block 11211 of the first swing arm 1121 and that are accommodated in the first arc-shaped slot 11111 of the swing arm support are gradually reduced, and parts that are of the first support arm 1122 and that are accommodated in the first sliding slot 11232 of the first housing support 1123 are gradually increased. On the contrary, when the electronic device is switched from the closed state to the unfolded state, the first housing support 1123 rotates clockwise, and drives the first swing arm 1121 and the first support arm 1122 to rotate clockwise around the module support synchronously. The parts that are of the first arc-shaped block 11211 of the first swing arm 1121 and that are accommodated in the first arc-shaped slot 11111 of the swing arm support are gradually increased, and the parts that are of the first support arm 1122 and that are accommodated in the first sliding slot 11232 of the first housing support 1123 are gradually reduced.

The foregoing describes the connection relationships between the first housing support 1123 and the first swing arm 1121 and between the first housing support 1123 and the first support arm 1122. The following describes a specific disposition manner of the first door plate 1124.

Refer to FIG. 6 again. As described above, the first door plate 1124 may be rotatably connected to the first housing support 1123, and rotatably connected to the first swing arm 1121. During specific implementation, the first rotation module 112 may further include a first connecting rod 1125. One end of the first connecting rod 1125 may be rotatably connected to the first swing arm 1121, and the other end of the first connecting rod 1125 may be rotatably connected to the first door plate 1124, so that a rotatable connection relationship between the first door plate 1124 and the first swing arm 1121 can be implemented by using the first connecting rod 1125.

Figure 9:
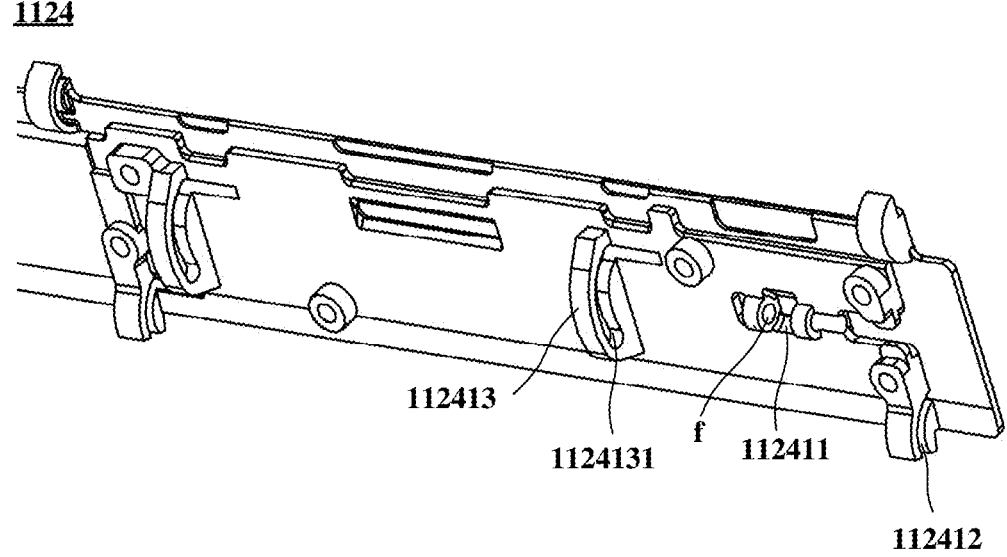
FIG. 9 is a diagram of a structure of a first door plate according to an embodiment of this application.
Figure 10:
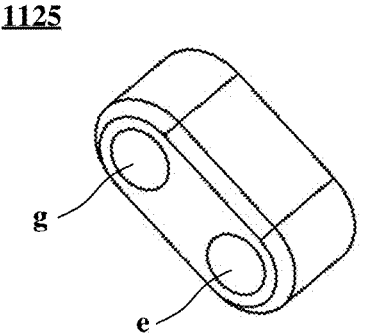
FIG. 10 is a diagram of a structure of a first connecting rod according to an embodiment of this application.

FIG. 9 is a diagram of a structure of the first door plate according to an embodiment of this application. FIG. 10 is a diagram of a structure of the first connecting rod according to an embodiment of this application. Refer to FIG. 5, FIG. 9, and FIG. 10 together. A first mounting slot 11212 may be provided on a surface that is of the first swing arm 1121 and that faces the first door plate 1124. A second mounting slot 112411 may be provided on a surface that is of the first door plate 1124 and that faces the first swing arm 1121. One end of the first connecting rod 1125 is rotatably disposed in the first mounting slot 11212, and the other end of the first connecting rod 1125 is rotatably disposed in the second mounting slot 112411. During specific implementation, a hinge hole d may be provided on a groove wall of the first mounting slot 11212. A hinge hole e is provided on one end of the first connecting rod. The first connecting rod 1125 may be rotatably connected to the first swing arm 1121 by using a pin shaft rotatably disposed in the hinge hole e of the first connecting rod 1125 and the hinge hole d of the first mounting slot 11212. Similarly, a hinge hole f may be provided on a groove wall of the second mounting slot 112411, and a hinge hole g may be provided on the other end of the first connecting rod 1125. The first connecting rod 1125 may be rotatably connected to the first door plate 1124 by using a pin shaft rotatably disposed in the hinge hole g of the first connecting rod 1125 and the hinge hole f of the second mounting slot.

Refer to FIG. 6 and FIG. 9 together. When the first door plate 1124 is rotatably connected to the first housing support 1123, a third arc-shaped rotation block 11233 may be disposed on the first housing support 1123. Correspondingly, a third arc-shaped slot 112412 may be provided on a surface that is of the first door plate 1124 and that faces the first housing support 1123. The third arc-shaped rotation block 11233 of the first housing support 1123 may be accommodated in the third arc-shaped slot 112412, and may rotate along an arc-shaped surface of the third arc-shaped slot 112412, so that a rotatable connection relationship between the first housing support 1123 and the first door plate 1124 can be implemented.

In a specific embodiment, there may be two third arc-shaped rotation blocks 11233, and the two third arc-shaped rotation blocks 11233 may be disposed at two ends that are of the first housing support 1123 and that are along the length direction of the support mechanism. Correspondingly, two third arc-shaped slots may also be provided on the first door plate 1124 along the length direction of the support mechanism, and the two third arc-shaped rotation blocks 11233 are respectively rotatably disposed in the corresponding third arc-shaped slots 112412. Stability of relative motion between the first door plate 1124 and the first housing support 1123 can be effectively improved through rotation cooperation between the third arc-shaped rotation block 11233 and the third arc-shaped slot 112412.

Figure 11:
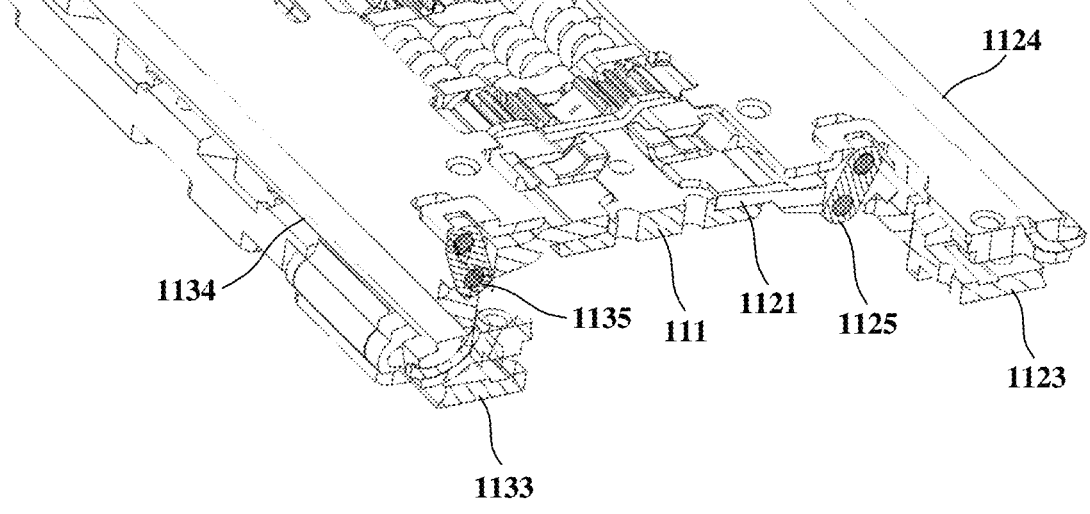
FIG. 11 is a sectional view of a partial structure of a support mechanism according to an embodiment of this application.

FIG. 11 is a sectional view of a partial structure of the support mechanism according to an embodiment of this application. As shown in FIG. 11, with reference to the foregoing description, it can be learned that, based on the rotatable connection relationships between the first swing arm 1121 and the first housing support 1123, between the first housing support 1123 and the first door plate 1124, between the first door plate 1124 and the first connecting rod 1125, and between the first connecting rod 1125 and the first swing arm 1121, the first swing arm 1121, the first housing support 1123, the first door plate 1124, and the first connecting rod 1125 may roughly form a four-connecting rod mechanism. When the electronic device is switched from the unfolded state to the closed state, the first housing support 1123 drives the first swing arm 1121 to rotate anticlockwise synchronously. In a rotation process, the first swing arm 1121 pulls the first door plate 1124 by using the first connecting rod 1125. Under constraint of the first connecting rod 1125 and the first housing support 1123, the first door plate 1124 also rotates anticlockwise relative to the module support 111. On the contrary, when the electronic device is switched from the closed state to the unfolded state, the first housing support 1123 drives the first swing arm 1121 to rotate clockwise synchronously. In a rotation process, the first swing arm 1121 pushes the first door plate 1124 by using the first connecting rod 1125. Under constraint of the first connecting rod 1125 and the first housing support 1123, the first door plate 1124 also rotates clockwise relative to the module support 111. Through a design of the quasi-four-connecting rod mechanism, motion accuracy of the electronic device in unfolding and closing processes can be effectively improved, a force-bearing state of the first door plate 1124 can be improved, and reliability of an entire structure of the electronic device in which the support mechanism is used can be improved.

Refer to FIG. 9 again. To improve motion stability of the first door plate 1124, in some embodiments, a first projection 112413 may be further disposed on the surface that is of the first door plate 1124 and that faces away from the flexible display. The first projection 112413 may be located on a side of the first support arm 1122 along the length direction of the support mechanism, for example, may be located on a side that is of the first support arm 1122 and on which no first sliding block 11221 is disposed (refer to FIG. 7). A first sliding shaft 11222 may be disposed on this side of the first support arm 1122. Correspondingly, a first rotary sliding slot 1124131 may be provided on a surface that is of the first projection 112413 and that faces the first support arm 1122. The first sliding shaft 11222 may be accommodated in the first rotary sliding slot 1124131 and may slide along the first rotary sliding slot 1124131, so that the first door plate 1124 and the first support arm 1122 can be rotatably connected through cooperation between the first sliding shaft 11222 and the first rotary sliding slot 1124131. In the unfolding and closing processes of the electronic device, the first door plate 1124 may be jointly driven by the first housing support 1123, the first connecting rod 1125, and the first support arm 1122 to rotate, which helps further improve motion reliability and stability of the first door plate 1124.

Figure 12:
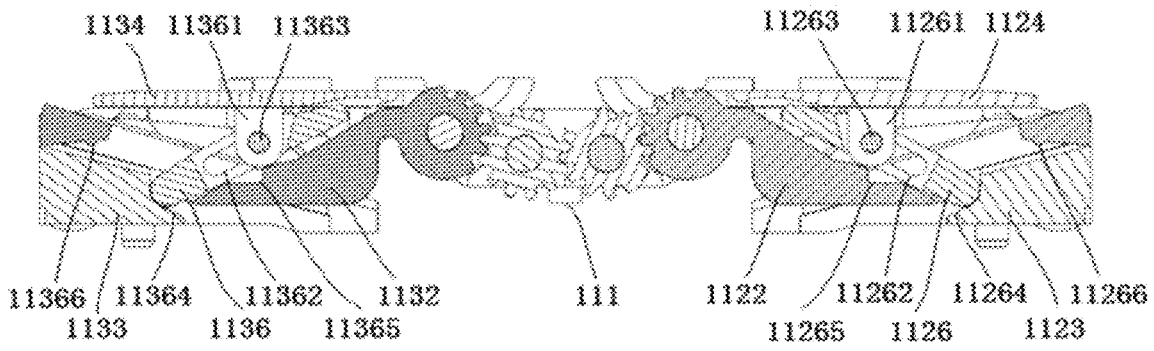
FIG. 12 is a sectional view of a partial structure of a support mechanism in an unfolded state according to an embodiment of this application.
Figure 13:
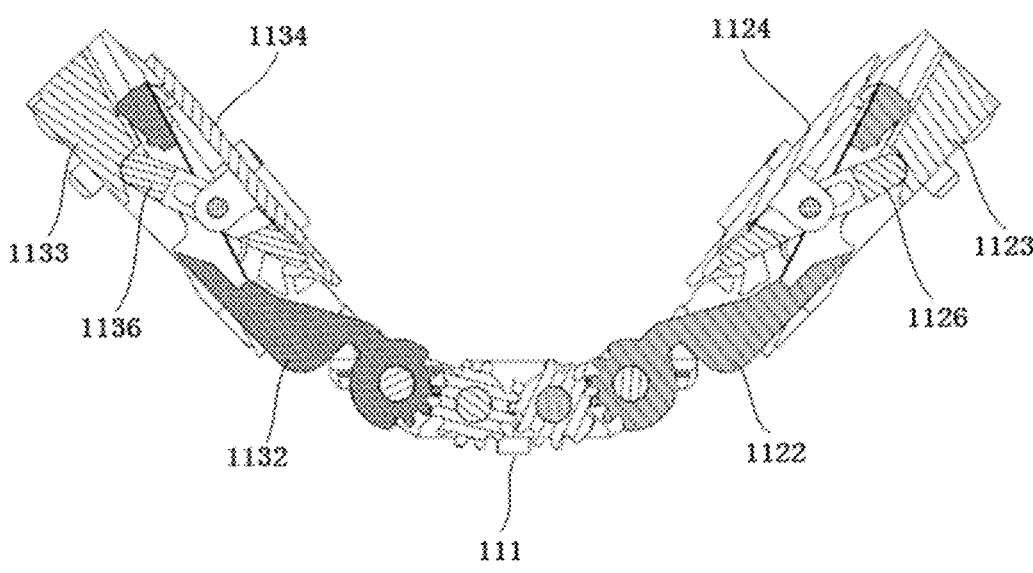
FIG. 13 is a sectional view of a partial structure of a support mechanism in an intermediate state according to an embodiment of this application.
Figure 14:
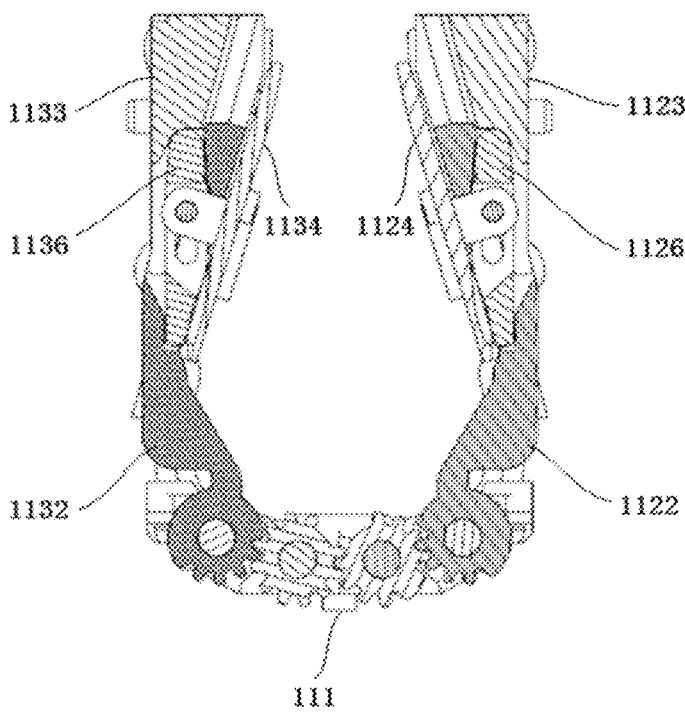
FIG. 14 is a sectional view of a partial structure of a support mechanism in a closed state according to an embodiment of this application.

FIG. 12 is a sectional view of a partial structure of the support mechanism in the unfolded state according to an embodiment of this application. FIG. 13 is a sectional view of a partial structure of the support mechanism in the intermediate state according to an embodiment of this application. FIG. 14 is a sectional view of a partial structure of the support mechanism in the closed state according to an embodiment of this application. Refer to FIG. 12 to FIG. 14.

In this embodiment of this application, the first rotation module may further include a first swing rod 1126. The first swing rod 1126 is movably connected to the surface that is of the first door plate 1124 and that faces away from the flexible display. Specifically, the first swing rod 1126 may be slidably connected to the first door plate 1124.

In a specific embodiment, a first mounting bracket 11261 may be disposed on the surface that is of the first door plate 1124 and that faces away from the flexible display. Specifically, one end of the first mounting bracket 11261 is fastened to the first door plate 1124. A first limiting sliding slot 11262 may be provided between a first end and a second end of the first swing rod 1126, and the other end of the first mounting bracket 11261 is slidably connected to the first limiting sliding slot 11262, so that a slidable connection relationship between the first swing rod 1126 and the first mounting bracket 11261 is implemented, and a slidable connection relationship between the first swing rod 1126 and the first door plate 1124 is implemented. During specific implementation, the other end of the first mounting bracket 11261 may be slidably and rotatably connected to the first limiting sliding slot 11262 by using a first limiting shaft 11263. Specifically, a hinge hole is provided at the other end of the first mounting bracket 11261. One end of the first limiting shaft 11263 is rotatably disposed in the hinge hole, and the other end of the first limiting shaft 11263 is slidably disposed in the first limiting sliding slot 11262.

To improve position stability of the first housing support 1123 relative to the module support 111, in some embodiments, the first end of the first swing rod 1126 is rotatably connected to the first housing support 1123, and a rotation axis of the first swing rod 1126 is set along the length direction of the support mechanism. As described above, when the electronic device is switched between the unfolded state and the closed state, the first door plate 1124 rotates. In this case, because the first swing rod 1126 is slidably connected to the first door plate 1124, the first swing rod 1126 may rotate relative to the first housing support 1123 under driving of the first door plate 1124, and the second end of the first swing rod 1126 moves in a direction away from or close to the first door plate 1124. Specifically, with reference to FIG. 12 and FIG. 13, when the electronic device is switched from the unfolded state to the closed state, the second end of the first swing rod 1126 moves in the direction away from the first door plate 1124. As shown in FIG. 14, when the electronic device is switched to the closed state, the second end of the first swing rod 1126 abuts against the first support arm 1122, that is, the two ends of the first swing rod 1126 are respectively connected to the first housing support 1123 and the first support arm 1122. The first swing rod 1126 provides support between the first housing support 1123 and the first support arm 1122, so that a relative position between the first housing support 1123 and the first support arm 1122 is stable, and a relative position between the first housing support 1123 and the module support 111 is stable. When the electronic device is switched to the closed state, the first swing rod 1126 may be perpendicular to the module support 111 or form a small included angle with the module support 111. When the electronic device falls, the first housing support 1123 does not have a displacement or has a small displacement relative to the module support 111. Therefore, the flexible display fastened to the first housing support 1123 does not have a displacement or has a small displacement. This can effectively prevent the flexible display from collapsing when the electronic device falls and from colliding with and being squeezed by other parts, effectively reduce a probability that the flexible display is damaged and fails, improve stability of the flexible display, and prolong a service life of the flexible display. On the contrary, when the electronic device is switched from the closed state to the unfolded state, the second end of the first swing rod 1126 moves in the direction close to the first door plate 1124, and the first swing rod 1126 cancels support for the first housing support 1123.

In a specific embodiment, a first limiting slot 11264 is provided on the surface that is of the first housing support 1123 and that faces the first door plate 1124. The first end of the first swing rod 1126 is rotatably disposed in the first limiting slot 11264. Specifically, the first end of the first swing rod 1126 may be rotatably disposed in the first limiting slot 11264 by using a first rotation shaft. During specific implementation, a hinge hole may be provided on a surface that is of the first swing rod 1126 and that faces the first limiting slot 11264, and a hinge hole may also be provided on a surface that is of the first limiting slot 11264 and that faces the first swing rod 1126. The first rotation shaft may be separately rotatably connected to the hinge hole of the first swing rod 1126 and the hinge hole of the first limiting slot 11264, so that a rotatable connection relationship between the first swing rod 1126 and the first limiting slot 11264 is implemented, and a rotatable connection relationship between the first swing rod 1126 and the first housing support 1123 is implemented.

In addition, a second limiting slot 11265 is provided on a surface that is of the first support arm 1122 and that faces the first door plate 1124. When the electronic device is switched to the closed state, the second end of the first swing rod 1126 abuts against the second limiting slot 11265, so that the first swing rod 1126 provides support between the first housing support 1123 and the first support arm 1122. During specific implementation, a surface that is of the second limiting slot 11265 and that abuts against the second end of the first swing rod 1126 may be a plane, to improve position stability of the first swing rod 1126. In addition, the plane may be perpendicular to a rotation axis of the first support arm 1122. In this way, the first swing rod 1126 may provide a support force perpendicular to the rotation axis of the first support arm 1122 for the first housing support 1123, so that the first swing rod 1126 can more effectively provide support, and support for the first housing support 1123 is more reliable. Based on similar considerations, a surface that is of the second end of the first swing rod 1126 and that abuts against the second limiting slot 11265 may also be a plane. During actual disposition, there may be a plurality of first swing rods 1126. For example, when there are a plurality of first support arms 1122, a quantity of first swing rods 1126 may be the same as a quantity of first support arms 1122, and the first swing rods 1126 are disposed in a one-to-one correspondence with the first support arms 1122.

To enable the first swing rod 1126 to reliably rotate in place to abut against the first support arm 1122, so as to effectively support the first housing support 1123, a first protrusion 11266 may be provided on the surface that is of the first support arm 1122 and that faces away from the first door plate 1124. Specifically, the first protrusion 11266 is closer to the module support 111 compared with the first end of the first swing rod 1126. When the electronic device is switched from the unfolded state to the closed state, for example, when the electronic device approaches the closed state, the first protrusion 11266 may abut against the first swing rod 1126. When the electronic device continues to be switched to the closed state, the first protrusion 11266 may push the first swing rod 1126 to rotate until the second end of the first swing rod 1126 abuts against the first support arm

1122. Specifically, the first protrusion 11266 may abut against the first end of the first swing rod 1126.

Figure 15:
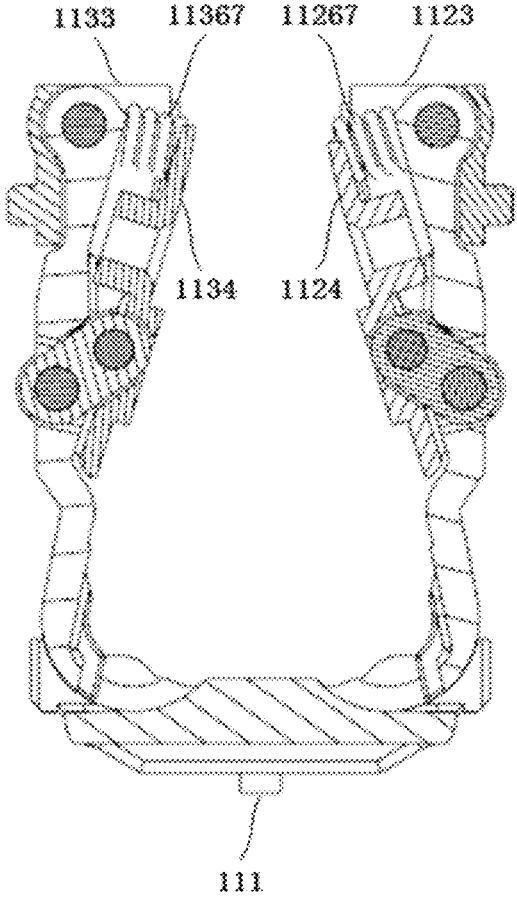
FIG. 15 is a diagram of a partial structure of a support mechanism in a closed state according to an embodiment of this application.

FIG. 15 is a diagram of a partial structure of the support mechanism in the closed state according to an embodiment of this application. With reference to FIG. 12 and FIG. 15, in this embodiment, to enable the first door plate 1124 to rotate in place when the electronic device is switched to the closed state, so that the first swing rod 1126 reliably rotates in place to abut against the first support arm 1122, a first elastic part 11267 may be disposed between the first housing support 1123 and one end that is of the first door plate 1124 and that is away from the module support 111. Two ends of the first elastic part 11267 may respectively abut against the first housing support 1123 and the end that is of the first door plate 1124 and that is away from the module support 111, that is, the first elastic part 11267 may be clamped between the first housing support 1123 and the end that is of the first door plate 1124 and that is away from the module support 111. During specific implementation, when the electronic device is in the unfolded state, the first elastic part 11267 may be in a compressed state. In a process in which the electronic device is switched from the unfolded state to the closed state, the first elastic part 11267 may push the first door plate 1124 to rotate. When the electronic device is switched to the closed state, the first elastic part 11267 pushes the first door plate 1124 to rotate to a first position, so that the first swing rod 1126 reliably rotates in place to abut against the first support arm 1122. In addition, the first elastic part 11267 pushes the first door plate 1124 to rotate in place, to further avoid a case in which the flexible display is squeezed because the first door plate 1124 rotates at a small angle and large enough screen accommodation space cannot be formed, and avoid generation of a crease on the flexible display. Specifically, the first elastic part 11267 may be a spring or the like.

Figure 16:
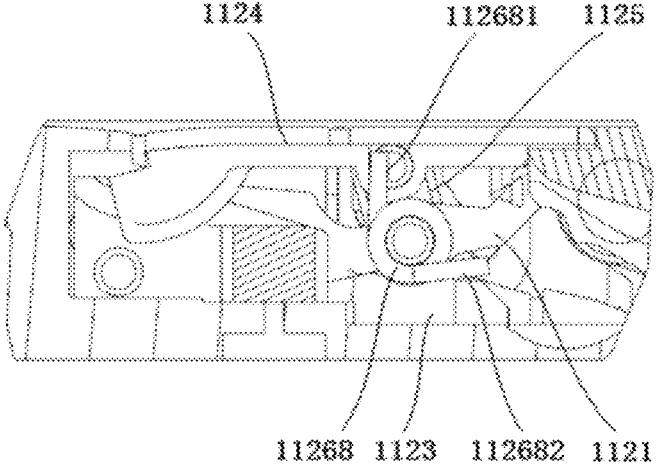
FIG. 16 is a diagram of a partial structure of a support mechanism in an unfolded state according to an embodiment of this application.
Figure 17:
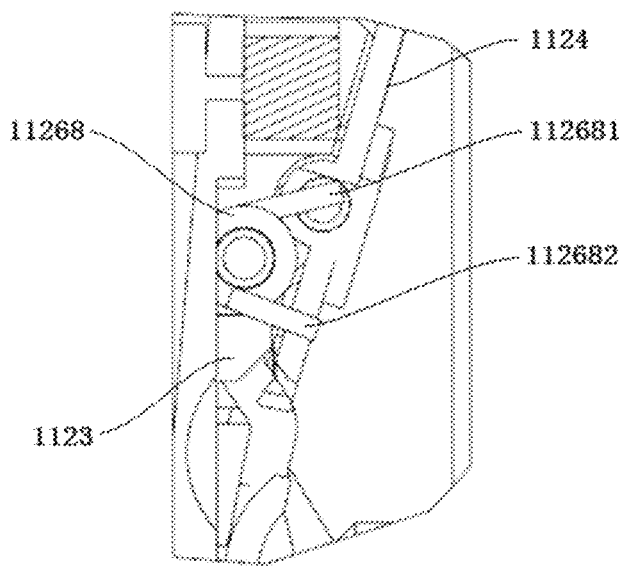
FIG. 17 is a diagram of a partial structure of a support mechanism in a closed state according to an embodiment of this application.

FIG. 16 is a diagram of a partial structure of the support mechanism in the unfolded state according to an embodiment of this application. FIG. 17 is a diagram of a partial structure of the support mechanism in the closed state according to an embodiment of this application. With reference to FIG. 12, FIG. 16, and FIG. 17, based on similar considerations, a first torsion spring 11268 may be disposed between the first housing support 1123 and one end that is of the first door plate 1124 and that is close to the module support 111. The first torsion spring 11268 has a first rotation arm 112681 and a second rotation arm 112682. The first torsion spring 11268 may be rotatably disposed on the first housing support 1123. The first rotation arm 112681 may abut against the end that is of the first door plate 1124 and that is close to the module support 111. The second rotation arm 112682 may abut against the first housing support 1123. During specific implementation, when the electronic device is in the unfolded state, the first torsion spring 11268 may be in a loosened state. In the process in which the electronic device is switched from the unfolded state to the closed state, the first torsion spring 11268 is squeezed by the first door plate 1124 and applies a reaction force to the first door plate 1124 to push the first door plate 1124 to rotate along a rotation direction of the first door plate 1124. When the electronic device is switched to the closed state, the first torsion spring 11268 pushes the first door plate 1124 to rotate to the first position, so that the first swing rod 1126 reliably rotates in place to abut against the first support arm 1122. Similarly, the first torsion spring 11268 pushes the first door plate 1124 to rotate in place, to further avoid the case in which the flexible display is squeezed because the first door plate 1124 rotates at a small angle and large enough screen accommodation space cannot be formed, and avoid generation of a crease on the flexible display. Specifically, the first torsion spring 11268 may be rotatably disposed on the first housing support 1123 by using a first coupling shaft. More specifically, hinge holes may be provided at the first housing support 1123 and a corresponding position at the end that is of the first door plate 1124 and that is close to the module support 111. The first coupling shaft may be rotatably connected to the hinge holes, and the first torsion spring 11268 may be sleeved on the first coupling shaft. During specific implementation, the first torsion spring 11268 may be rotatably disposed at the end that is of the first connecting rod 1125 and that is rotatably connected to the first swing arm 1121, to push the first door plate 1124 to rotate.

It may be understood that, the support mechanism provided in embodiments of this application may adopt one or more of the foregoing three implementations that ensure that the first swing rod 1126 reliably supports the first housing support 1123. This is not limited in this application.

As described above, the first rotation module 112 and the second rotation module 113 may be respectively disposed on the two sides of the module support 111. During specific implementation, refer to FIG. 4 again. The second rotation module 113 may include a second swing arm 1131, a second support arm 1132, a second housing support 1133, a second door plate 1134, and a second connecting rod 1135. The second door plate 1134 may be used to support the flexible display, and is fastened to the flexible display. The second swing arm 1131 and the second support arm 1132 may be disposed on a surface that is of the second door plate 1134 and that faces away from the flexible display. The second swing arm 1131 and the second support arm 1132 are distributed along the length direction of the support mechanism, and are separately rotatably connected to the module support 111. The second housing support 1133 may be located on surfaces that are of the second swing arm 1131 and the second support arm 1132 and that face away from the second door plate 1134. The second housing support 1133 may be used to be fastened to the second housing.

With reference to FIG. 4 and FIG. 8, similar to the first swing arm 1121, the second swing arm 1131 may also be rotatably connected to the swing arm support 1111. During specific implementation, a second arc-shaped rotation block 11311 may be disposed at one end that is of the second swing arm 1131 and that is used to be connected to the swing arm support 1111. Correspondingly, a second arc-shaped slot 11113 may be provided on the swing arm support 1111, and the second arc-shaped rotation block 11311 may be slidably disposed in the second arc-shaped slot 11113.

A second opening groove 11331 may be provided on a side that is of the second housing support 1133 and that faces the second swing arm 1131, and one end that is of the second swing arm 1131 and that is away from the swing arm support 1111 may be disposed in the second opening groove 11331. Hinge holes may be separately provided on a groove wall of the second opening groove 11331 and one end that is of the second swing arm 1131 and that is away from the swing arm support 1111. The second swing arm 1131 may be rotatably connected to the second housing support 1133 by using a pin shaft rotatably disposed in the hinge holes of the groove wall of the second opening groove 11331 and the end that is of the second swing arm 1131 and that is away from the swing arm support 1111. A second sliding slot 11332 may be further provided on the second housing support 1133. The second sliding slot 11332 and the second opening groove 11331 may be located on a same side of the second housing support 1133. One end that is of the second support arm 1132 and that is away from the module support in is mounted in the second sliding slot 11332, and may slide in the second sliding slot 11332.

In addition, there may be one or more second support arms 1132, and the plurality of second support arms 1132 may be arranged along the length direction of the support mechanism. Correspondingly, the second sliding slot 11332/second sliding slots 11332 that is/are in a one-to-one correspondence with the one or more second support arms 1132 may be provided on the second housing support 1133, and each second support arm 1132 is slidably assembled in the corresponding second sliding slot 11332, so that connection stability between the second support arm 1132 and the second housing support 1133 is improved through cooperation between a plurality of groups of second support arms 1132 and second sliding slots 11332.

Refer to FIG. 2 and FIG. 4. The second door plate 1134 may be rotatably connected to the second housing support 1133, and rotatably connected to the second swing arm 1131. During specific implementation, one end of the second connecting rod 1135 may be rotatably connected to the second swing arm 1131, and the other end of the second connecting rod 1135 may be rotatably connected to the second door plate 1134, so that a rotatable connection relationship between the second door plate 1134 and the second swing arm 1131 can be implemented by using the second connecting rod 1135.

In a specific embodiment, a third mounting slot 11312 may be provided on a surface that is of the second swing arm 1131 and that faces the second door plate 1134. A fourth mounting slot 113411 may be provided on a surface that is of the second door plate 1134 and that faces the second swing arm 1131. One end of the second connecting rod 1135 is rotatably disposed in the third mounting slot 11312, and the other end of the second connecting rod 1135 is rotatably disposed in the fourth mounting slot 113411.

When the second door plate 1134 is rotatably connected to the second housing support 1133, a fourth arc-shaped rotation block 11333 may be disposed on the second housing support 1133. Correspondingly, a fourth arc-shaped slot 113412 may be provided on a surface that is of the second door plate 1134 and that faces the second housing support 1133. The fourth arc-shaped block 11333 of the second housing support 1133 may be slidably disposed in the fourth arc-shaped slot 113412, so that the second housing support 1133 and the second door plate 1134 are rotatably connected.

In addition, a second projection may be further provided on a surface that is of the second door plate support and that faces away from the flexible display. The second projection may be located on a side of the second support arm along the length direction of the hinge mechanism. A second sliding shaft may be disposed on a side that is of the second support arm and that faces the second projection. Correspondingly, a second rotary sliding slot may be provided on a side that is of the second projection and that faces the second support arm. The second sliding shaft may be accommodated in the second rotary sliding slot, and may slide along the second rotary sliding slot, so that the second door plate support and the second support arm can be rotatably connected through cooperation between the second sliding shaft and the second rotary sliding slot.

Refer to FIG. 12 again. The second rotation module may further include a second swing rod 1136. At least a part of the second swing rod 1136 is disposed on the surface that is of the second door plate 1134 and that faces away from the flexible display. The second swing rod 1136 is slidably connected to the second door plate 1134. During specific implementation, a second mounting bracket 11361 is disposed on the surface that is of the second door plate 1134 and that faces away from the flexible display. A second limiting sliding slot 11362 is provided between a first end and a second end of the second swing rod 1136. One end of the second mounting bracket 11361 is fastened to the second door plate 1134, and the other end of the second mounting bracket 11361 is slidably disposed in the second limiting sliding slot 11362. Specifically, the other end of the second mounting bracket 11361 is slidably disposed in the second limiting sliding slot 11362 by using a second limiting shaft 11363.

In addition, the first end of the second swing rod 1136 is rotatably connected to the second housing support 1133. When the electronic device is switched from the unfolded state to the closed state, the second end of the second swing rod 1136 moves in a direction away from the second door plate 1134. When the electronic device is switched to the closed state, the second end of the second swing rod 1136 abuts against the second support arm 1132, that is, the two ends of the second swing rod 1136 are respectively connected to the second housing support 1133 and the second support arm 1132. The second swing rod 1136 provides support between the second housing support 1133 and the second support arm 1132, so that a relative position between the second housing support 1133 and the second support arm 1132 is stable, and a relative position between the second housing support 1133 and the module support 111 is stable. In this case, the first swing rod 1126 and the second swing rod 1136 may be parallel to each other or form a small included angle.

During specific implementation, a third limiting slot 11364 is provided on a surface that is of the second housing support 1133 and that faces the second door plate 1134. The first end of the second swing rod 1136 is rotatably disposed in the third limiting slot 11364. Specifically, the first end of the second swing rod 1136 is rotatably disposed in the third limiting slot 11364 using a second rotation shaft. A fourth limiting slot 11365 is provided on a surface that is of the second support arm 1132 and that faces the second door plate 1134. When the electronic device is switched to the closed state, the second end of the second swing rod 1136 abuts against the fourth limiting slot 11365.

To enable the second swing rod 1136 to reliably rotate in place to abut against the second support arm 1132, so as to effectively support the second housing support 1133, a second protrusion 11366 is provided on a surface that is of the second support arm 1132 and that faces away from the second door plate 1134. The second protrusion 11366 may abut against the first end of the second swing rod 1136, to push the second swing rod 1136 to rotate until the second end of the second swing rod 1136 abuts against the second support arm 1132.

Refer to FIG. 15 again. To enable the second door plate 1134 to rotate in place when the electronic device is switched to the closed state, so that the second swing rod 1136 reliably rotates in place to abut against the second support arm 1132, a second elastic part 11367 is disposed between the second housing support 1133 and one end that is of the second door plate 1134 and that is away from the module support 111. Two ends of the second elastic part 11367 respectively abut against the second housing support 1133 and the end that is of the second door plate 1134 and that is away from the module support 111. The second elastic part 11367 may push the second door plate 1134 to rotate to a second position.

Based on similar considerations, a second torsion spring is disposed between the second housing support 1133 and one end that is of the second door plate 1134 and that is close to the module support 111. The second torsion spring has a third rotation arm and a fourth rotation arm. The second torsion spring is rotatably disposed on the second housing support 1133. The third rotation arm abuts against the end that is of the second door plate 1134 and that is close to the module support 111. The fourth rotation arm abuts against the second housing support 1133. The second torsion spring may push the second door plate 1134 to rotate to the second position. Specifically, the second torsion spring is rotatably disposed on the second housing support 1133 by using a second coupling shaft. During specific implementation, the second torsion spring is rotatably disposed at the end that is of the second connecting rod and that is rotatably connected to the second swing arm.

Refer to FIG. 4 again. In this embodiment of this application, to better unfold and close the electronic device, a damping component 114 that may provide a damping force for the first rotation module and the second rotation module may be further disposed on the hinge mechanism, so that the first rotation module and the second rotation module can rotate stably under action of the damping force, to avoid mis-unfolding/mis-closing of the electronic device, and implement suspension of the two housings at a specified position.

Figure 18:
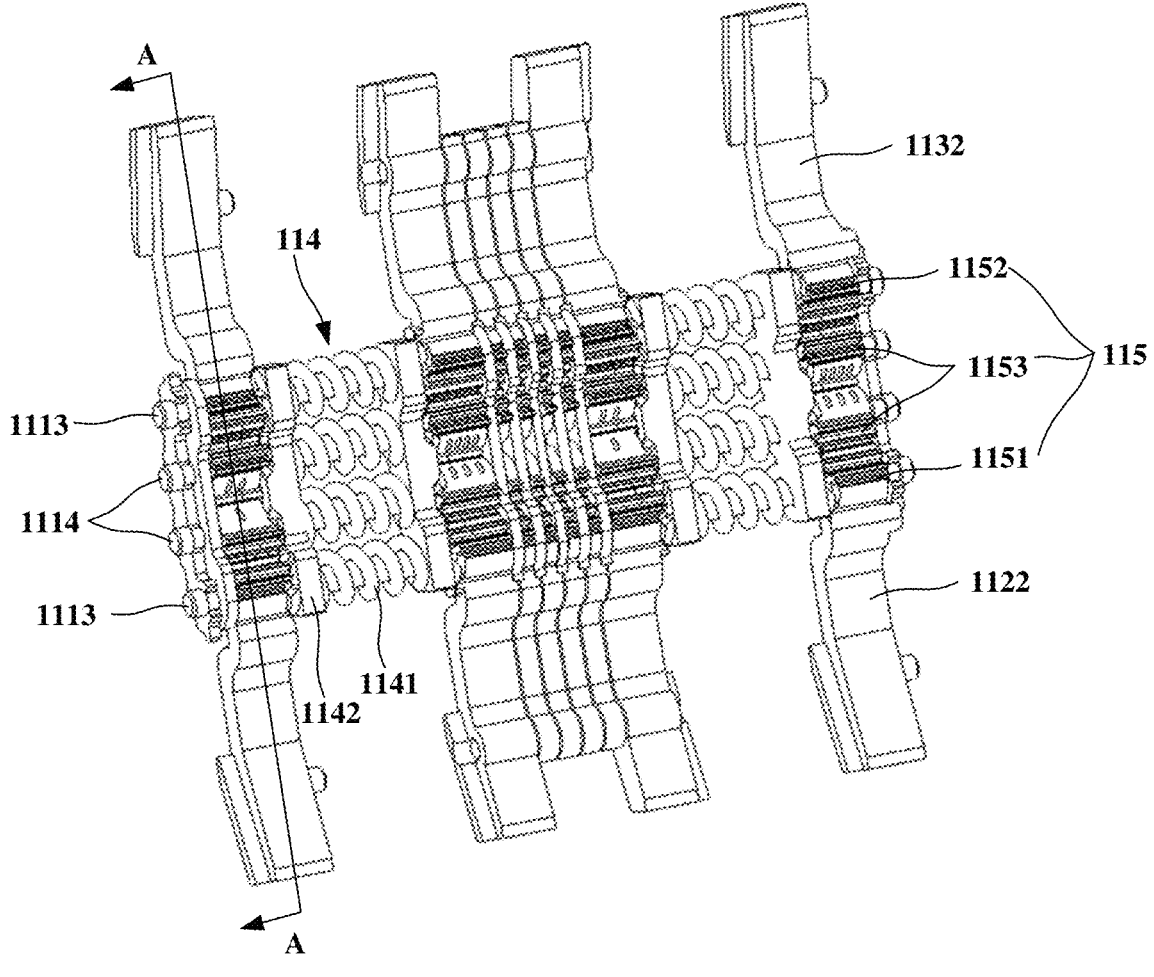
FIG. 18 is a diagram of a partial structure of a hinge mechanism according to an embodiment of this application.

FIG. 18 is a diagram of a partial structure of the hinge mechanism according to an embodiment of this application. The damping component 114 may include an elastic part 1141 and a conjoined cam 1142. The conjoined cam 1142 may be located between the elastic part 1141 and the first support arm 1122 and the second support arm 1132 along the length direction of the support mechanism. A first cam surface may be provided on an end part that is of the first support arm 1122 and that faces the conjoined cam 1142. A second cam surface may be provided on an end part that is of the second support arm 1132 and that faces the conjoined cam 1142. A third cam surface may be provided on an end part that is of the conjoined cam 1142 and that faces the first support arm 1122. A fourth cam surface may be provided on an end part that is of the conjoined cam 1142 and that faces the second support arm 1132. Under action of the elastic part 1141, the first cam surface abuts against the third cam surface, and the second cam surface abuts against the fourth cam surface.

In this embodiment of this application, each cam surface may include a plurality of protrusion parts. When slopes of protrusion parts of two cam surfaces that abut against each other are in contact with each other, a damping force that prevents the two cam surfaces from continuing to rotate relative to each other may be generated between the two cam surfaces. Based on this, in a process in which the two support arms rotate around corresponding pin shafts, the damping component 114 may separately provide a specific damping force for the two support arms. The damping force may be transferred to the first housing support by using the first support arm 1122, and transferred to the second housing support by using the second support arm 1132, to separately act on the two housings of the electronic device by using the two housing supports, so as to reduce a risk of mis-unfolding/mis-closing the electronic device, and implement suspension of the two housings at the specified position. In addition, through disposition of the damping component, a user can obtain an obvious operation feel in the unfolding or closing process of the electronic device, which helps improve use experience of the user.

With reference to FIG. 4, the hinge mechanism may further include one or more intermediate shafts 1114 disposed between the damping support 1112 and the swing arm support 1111. These intermediate shafts 1114 may be located between the two pin shafts 1113 on which the first support arm 1122 and the second support arm 1132 are hinged, and the intermediate shafts 1114 may also extend along the length direction of the support mechanism. A plurality of through holes may be provided on the conjoined cam 1142. The conjoined cam 1142 may be sleeved on the pin shaft 1113 and the intermediate shaft 1114 through the plurality of through holes. The elastic part 1141 may include a plurality of springs disposed side by side. Each spring is also sleeved on the pin shaft 1113 and the intermediate shaft 1114, to avoid displacement of the spring when elastic deformation occurs.

In addition, there may be a plurality of groups of damping components 114. For example, when there are three first support arms 1122 and three second support arms 1132, there may be two groups of damping components 114. The two groups of damping components 114 are separately disposed between two adjacent first support arms 1122 (or two adjacent second support arms 1132), to provide a sufficient damping force for the first rotation module and the second rotation module, and further improve unfolding/closing reliability of the electronic device.

In addition to the foregoing structure, in some embodiments of this application, the hinge mechanism may further include a synchronization component 115. The synchronization component 115 may include a first driving gear 1151 disposed on the first support arm 1122 and a second driving gear 1152 disposed on the second support arm 1132. The first driving gear 1151 is in transmission connection to the second driving gear 1152. In this way, in a process in which one support arm rotates around the module support, the other support arm may be driven to rotate synchronously around the module support in a direction facing or facing away from the one support arm, and the two support arms rotate at a same angle. In the process in which the support arm rotates around the module support, a housing support on a same side may be driven to rotate at a same angle, so that the two housing supports can rotate synchronously in a process in which the two support arms rotate synchronously. In addition, because the housing support may be fastened to the housing of the electronic device, synchronous rotation of the two housing supports may enable the two housings of the electronic device to rotate synchronously.

Figure 19:
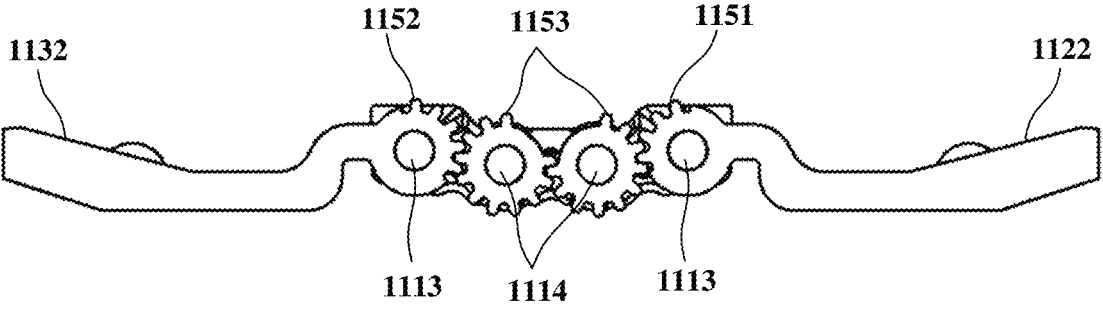
FIG. 19 is a sectional view of the hinge mechanism shown in FIG. 18 at A-A.

FIG. 19 is a sectional view of the hinge mechanism shown in FIG. 18 at A-A. In this embodiment of this application, the synchronization component may further include a driven gear 1153. The driven gear 1153 may be disposed between the first driving gear 1151 and the second driving gear 1152. In addition, there are an even number of driven gears 1153. Adjacent driven gears 1153 are engaged with each other, and adjacent driven gear 1153 and driving gear are engaged with each other, so that two driving gears can rotate synchronously by using the even number of driven gears 1153. During specific implementation, the driven gear 1153 may be sleeved on the intermediate shaft 1114, to improve motion stability of the synchronization component.

The foregoing descriptions are merely specific implementations of this application, but are not intended to limit the protection scope of this application. Any variation or replacement readily figured out by a person skilled in the art within the technical scope disclosed in this application shall fall within the protection scope of this application.

What is claimed is:

1. A support mechanism, comprising:

a first rotation module, comprising a first door plate, a first support arm, a first housing support, and a first swing rod, wherein the first door plate supports a flexible display, at least a part of the first support arm is disposed on a surface of the first door plate that faces away from the flexible display, at least a part of the first housing support is disposed on a surface that is of the first support arm and that faces away from the first door plate, the first door plate is rotatably connected to the first housing support, the first support arm is slidably connected to the first housing support, at least a part of the first swing rod is disposed on the surface of the first door plate that faces away from the flexible display, the first swing rod is slidably connected to the first door plate, and a first end of the first swing rod is rotatably connected to the first housing support;

a second rotation module, comprising a second door plate, a second support arm, a second housing support, and a second swing rod, wherein the second door plate supports the flexible display, at least a part of the second support arm is disposed on a surface of the second door plate that faces away from the flexible display, at least a part of the second housing support is disposed on a surface of the second support arm that faces away from the second door plate, the second door plate is rotatably connected to the second housing support, the second support arm is slidably connected to the second housing support, at least a part of the second swing rod is disposed on the surface that is of the second door plate and that faces away from the flexible display, the second swing rod is slidably connected to the second door plate, and a first end of the second swing rod is rotatably connected to the second housing support; and a module support, wherein the first rotation module and the second rotation module are respectively disposed on two sides of the module support, the first support arm is rotatably connected to the module support, and the second support arm is rotatably connected to the module support; and wherein when the first housing support and the second housing support rotate relative to each other, the first housing support drives the first support arm to rotate around the module support, and the first housing support drives the first door plate to rotate relative to the first housing support, causing one end that is of the first door plate and that is closest to the module support to move in a direction away from the module support;

wherein the first door plate drives the first swing rod to rotate relative to the first housing support, causing a second end of the first swing rod to move in a direction away from the first door plate;

wherein the second housing support drives the second support arm to rotate around the module support, and the second housing support drives the second door plate to rotate relative to the second housing support, causing one end of the second door plate that is closest to the module support to move in a direction away from the module support;

wherein the second door plate drives the second swing rod to rotate relative to the second housing support, causing a second end of the second swing rod to move in a direction away from the second door plate; and wherein when the first door plate rotates to a first position and the second door plate rotates to a second position, the first door plate and the second door plate form an included angle, the second end of the first swing rod abuts against the first support arm, and the second end of the second swing rod abuts against the second support arm.

2. The support mechanism according to claim 1, wherein a first limiting slot extends in a surface of the first housing support that faces the first door plate, the first end of the first swing rod is rotatably disposed in the first limiting slot, a second limiting slot extends in a surface of the first support arm that faces the first door plate, and the second end of the first swing rod abuts against the second limiting slot; and wherein a third limiting slot extends in a surface of the second housing support that faces the second door plate, the first end of the second swing rod is rotatably disposed in the third limiting slot, a fourth limiting slot extends in a surface of the second support arm that faces the second door plate, and the second end of the second swing rod abuts against the fourth limiting slot.

3. The support mechanism according to claim 2, wherein the first end of the first swing rod is rotatably disposed in the first limiting slot using a first rotation shaft; and wherein the first end of the second swing rod is rotatably disposed in the third limiting slot by using a second rotation shaft.

4. The support mechanism according to claim 1, wherein a first mounting bracket is disposed on the surface of the first door plate that faces away from the flexible display, a first limiting sliding slot extends between the first end of the first swing rod and the second end of the first swing rod, a first end of the first mounting bracket is fastened to the first door plate, and a second end of the first mounting bracket is slidably disposed in the first limiting sliding slot; and wherein a second mounting bracket is disposed on the surface of the second door plate that faces away from the flexible display, a second limiting sliding slot extends between the first end of the second swing rod and the second end of the second swing rod, a first end of the second mounting bracket is fastened to the second door plate, and a second end of the second mounting bracket is slidably disposed in the second limiting sliding slot.

5. The support mechanism according to claim 4, wherein the second end of the first mounting bracket is slidably disposed in the first limiting sliding slot using a first limiting shaft; and the second end of the second mounting bracket is slidably disposed in the second limiting sliding slot using a second limiting shaft.

6. The support mechanism according to claim 1, wherein when the first door plate rotates to the first position and the second door plate rotates to the second position, the first door plate and the second door plate form the included angle, and the first swing rod and the second swing rod are parallel or form an included angle.

7. The support mechanism according to claim 1, wherein a first protrusion extends from the surface of the first support arm that faces away from the first door plate, and the first protrusion abuts against the first end of the first swing rod, to push the first swing rod to rotate until the second end of the first swing rod abuts against the first support arm; and wherein a second protrusion extends from the surface of the second support arm that faces away from the second door plate, and the second protrusion abuts against the first end of the second swing rod, to push the second swing rod to rotate until the second end of the second swing rod abuts against the second support arm.

8. The support mechanism according to claim 1, wherein a first elastic part is disposed between the first housing support and a first end of the first door plate that is farthest away from the module support, two ends of the first elastic part respectively abut against the first housing support and the first end of the first door plate that is farthest away from the module support, and the first elastic part is configured to push the first door plate to rotate to the first position; and wherein a second elastic part is disposed between the second housing support and a first end of the second door plate that is farthest away from the module support, two ends of the second elastic part respectively abut against the second housing support and the first end of the second door plate that is farthest away from the module support, and the second elastic part is configured to push the second door plate to rotate to the second position.

9. The support mechanism according to claim 1, wherein a first torsion spring is disposed between the first housing support and the one end of the first door plate that is closest to the module support, the first torsion spring is rotatably disposed on the first housing support, the first torsion spring comprises a first rotation arm and a second rotation arm, the first rotation arm abuts against the one end of the first door plate that is closest to the module support, the second rotation arm abuts against the first housing support, and the first torsion spring is configured to push the first door plate to rotate to the first position; and a second torsion spring is disposed between the second housing support and the one end of the second door plate that is closest to the module support, the second torsion spring is rotatably disposed on the second housing support, the second torsion spring comprises a third rotation arm and a fourth rotation arm, the third rotation arm abuts against the one end of the second door plate that is closest to the module support, the fourth rotation arm abuts against the second housing support, and the second torsion spring is configured to push the second door plate to rotate to the second position.

10. The support mechanism according to claim 9, wherein the first torsion spring is rotatably disposed on the first housing support by using a first coupling shaft; and wherein the second torsion spring is rotatably disposed on the second housing support by using a second coupling shaft.

11. The support mechanism according to claim 9, wherein the first rotation module further comprises a first swing arm and a first connecting rod, at least a part of the first swing arm is disposed on the surface of the first door plate that faces away from the flexible display, the first swing arm and the first support arm are distributed along a length direction of the support mechanism, the first swing arm is rotatably connected to the module support, rotation axes of the first swing arm and the first support arm on the module support are different and parallel to each other, a first end of the first connecting rod is rotatably connected to the first swing arm, and a second end of the first connecting rod is rotatably connected to the first door plate;

wherein the first torsion spring is rotatably disposed at the end of the first connecting rod that is rotatably connected to the first swing arm;

wherein the second rotation module further comprises a second swing arm and a second connecting rod, at least a part of the second swing arm is disposed on the surface of the second door plate that faces away from the flexible display, the second swing arm and the second support arm are distributed along a length direction of the support mechanism, the second swing arm is rotatably connected to the module support, rotation axes of the second swing arm and the second support arm on the module support are different and parallel to each other, a first end of the second connecting rod is rotatably connected to the second swing arm, and a second end of the second connecting rod is rotatably connected to the second door plate; and wherein the second torsion spring is rotatably disposed at the end of the second connecting rod that is rotatably connected to the second swing arm.

12. An electronic device, comprising:

a first housing;

a second housing;

a flexible display; and a support mechanism, comprising:

a first rotation module, comprising a first door plate, a first support arm, a first housing support, and a first swing rod, the first door plate supports the flexible display, at least a part of the first support arm is disposed on a surface of the first door plate that faces away from the flexible display, at least a part of the first housing support is disposed on a surface of the first support arm that faces away from the first door plate, the first door plate is rotatably connected to the first housing support, the first support arm is slidably connected to the first housing support, at least a part of the first swing rod is disposed on the surface of the first door plate that faces away from the flexible display, the first swing rod is slidably connected to the first door plate, and a first end of the first swing rod is rotatably connected to the first housing support;

a second rotation module, comprising a second door plate, a second support arm, a second housing support, and a second swing rod, wherein the second door plate supports the flexible display, at least a part of the second support arm is disposed on a surface of the second door plate that faces away from the flexible display, at least a part of the second housing support is disposed on a surface of the second support arm that faces away from the second door plate, the second door plate is rotatably connected to the second housing support, the second support arm is slidably connected to the second housing support, at least a part of the second swing rod is disposed on the surface of the second door plate that faces away from the flexible display, the second swing rod is slidably connected to the second door plate, and a first end of the second swing rod is rotatably connected to the second housing support; and a module support, wherein the first rotation module and the second rotation module are respectively disposed on two sides of the module support, the first support arm is rotatably connected to the module support, the second support arm is rotatably connected to the module support;

wherein when the first housing support and the second housing support rotate relative to each other, the first housing support drives the first support arm to rotate around the module support, and the first housing support drives the first door plate to rotate relative to the first housing support, causing one end of the first door plate that is closest to the module support to move in a direction away from the module support;

wherein the first door plate drives the first swing rod to rotate relative to the first housing support, causing a second end of the first swing rod to move in a direction away from the first door plate;

wherein the second housing support drives the second support arm to rotate around the module support, and the second housing support drives the second door plate to rotate relative to the second housing support, causing one end of the second door plate that is closest to the module support to move in a direction away from the module support;

wherein the second door plate drives the second swing rod to rotate relative to the second housing support, causing a second end of the second swing rod to move in a direction away from the second door plate;

wherein when the first door plate rotates to a first position and the second door plate rotates to a second position, the first door plate and the second door plate form an included angle, the second end of the first swing rod abuts against the first support arm, and the second end of the second swing rod abuts against the second support arm;

wherein the first housing and the second housing are respectively disposed on two sides of the support mechanism, the first housing is fastened to the first housing support, and the second housing is fastened to the second housing support; and wherein the flexible display contiguously covers the first housing, the second housing, and the support mechanism, and the flexible display is fastened to the first housing and the second housing.

13. The electronic device according to claim 12, wherein a first limiting slot extends in a surface that is of the first housing support and that faces the first door plate, the first end of the first swing rod is rotatably disposed in the first limiting slot, a second limiting slot extends in a surface that is of the first support arm and that faces the first door plate, and the second end of the first swing rod abuts against the second limiting slot; and wherein a third limiting slot extends in a surface of the second housing support that faces the second door plate, the first end of the second swing rod is rotatably disposed in the third limiting slot, a fourth limiting slot extends in a surface of the second support arm that faces the second door plate, and the second end of the second swing rod abuts against the fourth limiting slot.

14. The electronic device according to claim 13, wherein the first end of the first swing rod is rotatably disposed in the first limiting slot by using a first rotation shaft; and wherein the first end of the second swing rod is rotatably disposed in the third limiting slot by using a second rotation shaft.

15. The electronic device according to claim 12, wherein a first mounting bracket is disposed on the surface of the first door plate that faces away from the flexible display, a first limiting sliding slot extends between the first end and the second end of the first swing rod, a first end of the first mounting bracket is fastened to the first door plate, and a second end of the first mounting bracket is slidably disposed in the first limiting sliding slot; and wherein a second mounting bracket is disposed on the surface of the second door plate that faces away from the flexible display, a second limiting sliding slot is provided between the first end and the second end of the second swing rod, a first end of the second mounting bracket is fastened to the second door plate, and a second end of the second mounting bracket is slidably disposed in the second limiting sliding slot.

16. The electronic device according to claim 15, wherein the second end of the first mounting bracket is slidably disposed in the first limiting sliding slot by using a first limiting shaft; and wherein the second end of the second mounting bracket is slidably disposed in the second limiting sliding slot by using a second limiting shaft.

17. The electronic device according to claim 12, wherein when the first door plate rotates to the first position and the second door plate rotates to the second position, the first door plate and the second door plate form the included angle, and the first swing rod and the second swing rod are parallel or form an included angle.

18. The electronic device according to claim 12, wherein a first protrusion extends from the surface that is of the first support arm and that faces away from the first door plate, and the first protrusion abuts against the first end of the first swing rod, to push the first swing rod to rotate until the second end of the first swing rod abuts against the first support arm; and a second protrusion extends from the surface that is of the second support arm and that faces away from the second door plate, and the second protrusion abuts against the first end of the second swing rod, to push the second swing rod to rotate until the second end of the second swing rod abuts against the second support arm.

19. The electronic device according to claim 12, wherein a first elastic part is disposed between the first housing support and a first end of the first door plate that is farthest away from the module support, two ends of the first elastic part respectively abut against the first housing support and the first end of the first door plate that is farthest away from the module support, and the first elastic part is configured to push the first door plate to rotate to the first position; and wherein a second elastic part is disposed between the second housing support and a first end of the second door plate that is away from the module support, two ends of the second elastic part respectively abut against the second housing support and the first end of the second door plate that is farthest away from the module support, and the second elastic part is configured to push the second door plate to rotate to the second position.

20. The electronic device according to claim 12, wherein a first torsion spring is disposed between the first housing support and the one end of the first door plate that is closest to the module support, the first torsion spring is rotatably disposed on the first housing support, the first torsion spring comprises a first rotation arm and a second rotation arm, the first rotation arm abuts against the one end of the first door plate and that is closest to the module support, the second rotation arm abuts against the first housing support, and the first torsion spring is configured to push the first door plate to rotate to the first position; and a second torsion spring is disposed between the second housing support and the one end of the second door plate that is closest to the module support, the second torsion spring is rotatably disposed on the second housing support, the second torsion spring comprises a third rotation arm and a fourth rotation arm, the third rotation arm abuts against the one end of the second door plate and that is closest to the module support, the fourth rotation arm abuts against the second housing support, and the second torsion spring is configured to push the second door plate to rotate to the second position.

* * * * *